US012364157B2

(12) United States Patent
Chen et al.

(10) Patent No.: US 12,364,157 B2
(45) Date of Patent: Jul. 15, 2025

(54) SHORT-WAVE INFRARED MATERIALS, DETECTORS, AND METHODS

(71) Applicants: Honda Motor Co., Ltd., Tokyo (JP); Utah State University, Logan, UT (US)

(72) Inventors: Gugang Chen, Palo Alto, CA (US); Yi Rao, Logan, UT (US)

(73) Assignees: Honda Motor Co., Ltd., Tokyo (JP); Utah State University, Logan, UT (US)

( * ) Notice: Subject to any disclaimer, the term of this patent is extended or adjusted under 35 U.S.C. 154(b) by 443 days.

(21) Appl. No.: 17/878,620

(22) Filed: Aug. 1, 2022

(65) Prior Publication Data

US 2024/0040923 A1    Feb. 1, 2024

(51) Int. Cl.
*H01L 51/00*    (2006.01)
*G01N 21/35*    (2014.01)
(Continued)

(52) U.S. Cl.
CPC ............ *H10K 85/30* (2023.02); *G01N 21/35* (2013.01); *H10K 30/10* (2023.02);
(Continued)

(58) Field of Classification Search
CPC .. H10K 85/30; H10K 30/10; H10K 2102/102; H10K 2102/103;
(Continued)

(56) References Cited

U.S. PATENT DOCUMENTS 9,472,697 B2    10/2016 Gordon et al.
10,371,627 B2    8/2019 Waxman et al.
(Continued)

FOREIGN PATENT DOCUMENTS

WO    WO-2008127297 A2 *   10/2008   ............. B65G 59/08
WO    WO-2018085211 A1 *    5/2018   ............ C03C 17/009

OTHER PUBLICATIONS

Naczynski, D. J.; Tan, M. C.; Zevon, M.; Wall, B.; Kohl, J.; Kulesa, A.; Chen, S.; Roth, C. M.; Riman, R. E.; Moghe, P. V., Rare-earth-doped biological composites as in vivo shortwave infrared reporters. Nat Commun 2013, 4, 2199.
(Continued)

*Primary Examiner* — Ermias T Woldegeorgis
(74) *Attorney, Agent, or Firm* — Patterson + Sheridan, LLP

(57) ABSTRACT

Aspects of the present disclosure generally relate to short-wave infrared (SWIR) materials, SWIR detectors, and methods of use. In an aspect, a SWIR detector is provided and includes a conductive layer disposed over a first portion of a substrate, the conductive layer having a trench therein, and a hole transport layer disposed over at least a second portion of the substrate and within the trench of the conductive layer. The SWIR detector further includes a light conversion layer disposed over at least a portion of the hole transport layer, the light conversion layer comprising a composition having the formula $A_aB_bM_cX_d$, wherein: A is an organic group or ion thereof; B is an organic group, an inorganic group, or ion thereof; M is a metal or ion thereof; X is a halogen or ion thereof; and a, b, c, and d are numbers expressing amounts of A, B, M, and X.

20 Claims, 6 Drawing Sheets

(51) Int. Cl.
H10K 30/10 (2023.01)
H10K 85/30 (2023.01)
H10K 102/00 (2023.01)
H10K 102/10 (2023.01)

(52) U.S. Cl.
CPC .............. G01N 2201/1235 (2013.01); H10K 2102/102 (2023.02); H10K 2102/103 (2023.02); H10K 2102/351 (2023.02)

(58) Field of Classification Search
CPC .. H10K 2102/351; H10K 30/20; H10K 30/40; H10K 39/32; H10K 85/50; H10K 85/60; H10K 30/60; H10K 30/81; H10K 30/82; H10K 30/86; G01N 21/35; G01N 2201/1235; G01D 5/26
See application file for complete search history.

(56) References Cited

U.S. PATENT DOCUMENTS

| | | |
|---|---|---|
| 2017/0027448 A1* | 2/2017 | Carr .................... A61B 5/12 |
| 2020/0185158 A1 | 6/2020 | Rao et al. |
| 2021/0155496 A1 | 5/2021 | Chen et al. |
| 2021/0175451 A1 | 6/2021 | Chen et al. |

OTHER PUBLICATIONS

Chen, D.; Huang, J.; Jackson, T. J., Vegetation water content estimation for corn and soybeans using spectral indices derived from MODIS near- and short-wave infrared bands. Remote Sensing of Environment 2005, 98 (2-3), 225-236.

Holst, G. C.; Krapels, K.; Driggers, R. G.; Larson, P.; Garcia, J.; Walden, B.; Agheera, S.; Deaver, D.; Hixson, J.; Boettcher, E., Small craft ID criteria (N50/V50) for short wave infrared sensors in maritime security. In Infrared Imaging Systems: Design, Analysis, Modeling, and Testing XIX, 2008.

Stange, D.; von den Driesch, N.; Rainko, D.; Roesgaard, S.; Povstugar, I.; Hartmann, J.-M.; Stoica, T.; Ikonic, Z.; Mantl, S.; Grutzmacher, D.; Buca, D., Short-wave infrared LEDs from GeSn/SiGeSn multiple quantum wells. Optica 2017, 4 (2).

Esteves, R. J. A.; Ho, M. Q.; Arachchige, I. U., Nanocrystalline Group IV Alloy Semiconductors: Synthesis and Characterization of Ge1-xSnx Quantum Dots for Tunable Bandgaps. Chemistry of Materials 2015, 27 (5), 1559-1568.

Li, X.; Zhu, H., The graphene-semiconductor Schottky junction. Physics Today 2016, 69 (9), 46-51.

Koppens, F. H.; Mueller, T.; Avouris, P.; Ferrari, A. C.; Vitiello, M. S.; Polini, M., Photodetectors based on graphene, other two-dimensional materials and hybrid systems. Nat Nanotechnol 2014, 9 (10), 780-93.

Ahmad, M. W.; Mourshed, M.; Mundow, D.; Sisinni, M.; Rezgui, Y., Building energy metering and environmental monitoring—A state-of-the-art review and directions for future research. Energy and Buildings 2016, 120, 85-102.

Azad, A. K.; Profeta, L. T.; Barnett, S. M.; Crocombe, R. A.; Druy, M. A.; Wierszewski, J. G.; Tazik, S. K.; Nelson, M. P.; Gomer, N. R.; Moon, D., Novel use of shortwave infrared hyperspectral imaging for standoff detection of explosives and narcotics in room clearing applications. In Next-Generation Spectroscopic Technologies XI, 2018.

Burschka, J.; Pellet, N.; Moon, S. J.; Humphry-Baker, R.; Gao, P.; Nazeeruddin, M. K.; Gratzel, M., Sequential deposition as a route to high-performance perovskite-sensitized solar cells. Nature 2013, 499 (7458), 316-9.

Jeon, N. J.; Noh, J. H.; Kim, Y. C.; Yang, W. S.; Ryu, S.; Seok, S. I., Solvent engineering for high-performance inorganic-organic hybrid perovskite solar cells. Nat Mater 2014, 13 (9), 897-903.

Im, J. H.; Jang, I. H.; Pellet, N.; Gratzel, M.; Park, N. G., Growth of CH3NH3PbI3 cuboids with controlled size for high-efficiency perovskite solar cells. Nat Nanotechnol 2014, 9 (11), 927-32.

Chen, H. W.; Sakai, N.; Jena, A. K.; Sanehira, Y.; Ikegami, M.; Ho, K. C.; Miyasaka, T., A Switchable High-Sensitivity Photodetecting and Photovoltaic Device with Perovskite Absorber. J Phys Chem Lett 2015, 6 (9), 1773-9.

Li, F.; Ma, C.; Wang, H.; Hu, W.; Yu, W.; Sheikh, A. D.; Wu, T., Ambipolar solution-processed hybrid perovskite phototransistors. Nat Commun 2015, 6, 8238.

Tan, Z. K.; Moghaddam, R. S.; Lai, M. L.; Docampo, P.; Higler, R.; Deschler, F.; Price, M.; Sadhanala, A.; Pazos, L. M.; Credgington, D.; Hanusch, F.; Bein, T.; Snaith, H. J.; Friend, R. H., Bright light-emitting diodes based on organometal halide perovskite. Nat Nanotechnol 2014, 9 (9), 687-92.

Kang, J.; Wang, L. W., High Defect Tolerance in Lead Halide Perovskite CsPbBr3. J Phys Chem Lett 2017, 8 (2), 489-493.

Garcia de Arquer, F. P.; Armin, A.; Meredith, P.; Sargent, E. H., Solution-processed semiconductors for next-generation photodetectors. Nature Reviews Materials 2017, 2 (3).

Shen, L .; Fang, Y.; Wang, D.; Bai, Y.; Deng, Y.; Wang, M.; Lu, Y.; Huang, J., A Self-Powered, Sub-nanosecond- Response Solution-Processed Hybrid Perovskite Photodetector for Time-Resolved Photoluminescence-Lifetime Detection. Adv Mater 2016, 28 (48), 10794-10800.

Pan, W.; Wu, H.; Luo, J.; Deng, Z.; Ge, C.; Chen, C.; Jiang, X.; Yin, W.-J.; Niu, G.; Zhu, L.; Yin, L.; Zhou, Y.; Xie, Q.; Ke, X.; Sui, M.; Tang, J., Cs2AgBiBr6 single-crystal X-ray detectors with a low detection limit. Nature Photonics 2017, 11 (11), 726-732.

Rao, H. S.; Li, W. G.; Chen, B. X.; Kuang, D. B.; Su, C. Y., In Situ Growth of 120 cm(2) CH3 NH3 PbBr3 Perovskite Crystal Film on FTO Glass for Narrowband-Photodetectors. Adv Mater 2017, 29 (16).

Adinolfi, V.; Ouellette, O.; Saidaminov, M. I.; Walters, G.; Abdelhady, A. L.; Bakr, O. M.; Sargent, E. H., Fast and Sensitive Solution-Processed Visible-Blind Perovskite UV Photodetectors. Adv Mater 2016, 28 (33), 7264-8.

Xu, X.; Chueh, C.-C.; Jing, P.; Yang, Z.; Shi, X.; Zhao, T.; Lin, L. Y.; Jen, A. K. Y., High-Performance Near-IR Photodetector Using Low-Bandgap MA0.5FA0.5Pb0.5Sn0.5I3Perovskite. Advanced Functional Materials 2017, 27 (28).

Rogalski, A.; Kopytko, M.; Martyniuk, P., Two-dimensional infrared and terahertz detectors: Outlook and status. Applied Physics Reviews 2019, 6 (2).

* cited by examiner

SHORT-WAVE INFRARED MATERIALS, DETECTORS, AND METHODS

FIELD

Aspects of the present disclosure generally relate to short-wave infrared materials, short-wave infrared detectors, and methods of use.

BACKGROUND

Short-wave infrared (SWIR) materials have become a significant focus of imaging, sensing, security, and electronic applications. The wavelength of light for SWIR—about 900 nm to about 2.7 µm—allows for SWIR detectors to have a number of advantages over visible light detectors when utilized in a variety of applications including produce inspection, electronic board inspection, identifying and sorting, surveillance, anti-counterfeiting, process quality control, among others. For example, water vapor, fog, and certain materials such as silicon can be transparent when imaging with SWIR light. Unlike mid-wave infrared (MWIR) and long-wave infrared (LWIR) light, which are emitted from an object, SWIR light can be similar to visible light in that photons are reflected or absorbed by an object, thereby providing high resolution and strong contrast need for high-resolution imaging.

SWIR photodetectors are traditionally made of certain narrow band-gap semiconductors or quantum-well and quantum-dot structures based on Group III to V materials, such as InGaAs, HgCdTe, InSb, Pb Se, and various other materials. However, Group III to V materials require complex fabrication processes, rendering SWIR photodetectors based on Group III to V materials expensive. Graphene-based SWIR photodetectors have been developed, but are limited by low light absorption (~2.3% of incident light) and ultra-short photo-induced carrier lifetime. In addition, traditional SWIR photodetectors using Group III to V materials (for example, InGaAs) typically require complex and expensive equipment for cryogenic operation.

There is a need for new SWIR materials and SWIR detectors.

SUMMARY

Aspects of the present disclosure generally relate to short-wave infrared (SWIR) materials, SWIR detectors, and methods of use. The SWIR materials described herein can be incorporated into devices for detecting, sensing, localizing, and/or imaging various objects by SWIR light or radiation. Unlike conventional detectors, SWIR detector devices described herein can operate at room temperature and have high photoresponsivity. Further, relative to conventional detectors, the SWIR detector devices described herein can be less complex and less costly to fabricate. Aspects described herein can find applications in automobiles, remote sensing, vehicle control, automated inspection, identifying and sorting, surveillance, anti-counterfeiting, and environmental chemical analysis, among other applications.

In an aspect, a short-wave infrared detector is provided. The short-wave infrared detector includes a conductive layer disposed over a first portion of a substrate, the conductive layer having a trench therein, and a hole transport layer disposed over at least a second portion of the substrate, at least a portion of the hole transport layer positioned within the trench of the conductive layer. The short-wave infrared detector further includes a light conversion layer disposed over at least a portion of the hole transport layer, the light conversion layer comprising a composition of formula (I): $A_a B_b M_c X_d$ (I), wherein: A is an organic group or ion thereof; B is an organic group, an inorganic group, or ion thereof, A and B being the same or different; M is a metal or ion thereof; X is a halogen or ion thereof; and a, b, c, and d are numbers expressing amounts of A, B, M, and X.

In another aspect, a short-wave infrared detection system is provided. The short-wave infrared detection system includes at least one processor, and an illumination source configured to illuminate a sampled location of an object or a scene. The short-wave infrared detection system further includes a detector configured to detect light from the sampled location, the detector comprising a light conversion layer, the light conversion layer comprising a composition of formula (I): $A_a B_b M_c X_d$ (I), wherein: A is an organic group or ion thereof; B is an organic group, an inorganic group, or ion thereof, B and A being the same or different; M is a metal or ion thereof; X is a halogen or ion thereof; and a, b, c, and d are numbers expressing amounts of A, B, M, and D.

In another aspect, a method is provided. The method includes directing a light beam comprising short-wave infrared light from an illumination source towards an object and illuminating a sampled location on the object. The method includes detecting, by a detector, light absorbed or reflected by the sampled location on the object, the detector comprising a light conversion layer, the light conversion layer comprising a composition of formula (I): $A_a B_b M_c X_d$ (I), wherein: A is an organic group or ion thereof; B is an organic group, an inorganic group, or ion thereof, B and A being the same or different; M is a metal or ion thereof; X is a halogen or ion thereof; and a, b, c, and d are numbers expressing amounts of A, B, M, and D.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, for the disclosure may admit to other equally effective aspects.

DETAILED DESCRIPTION

Figure 1A:
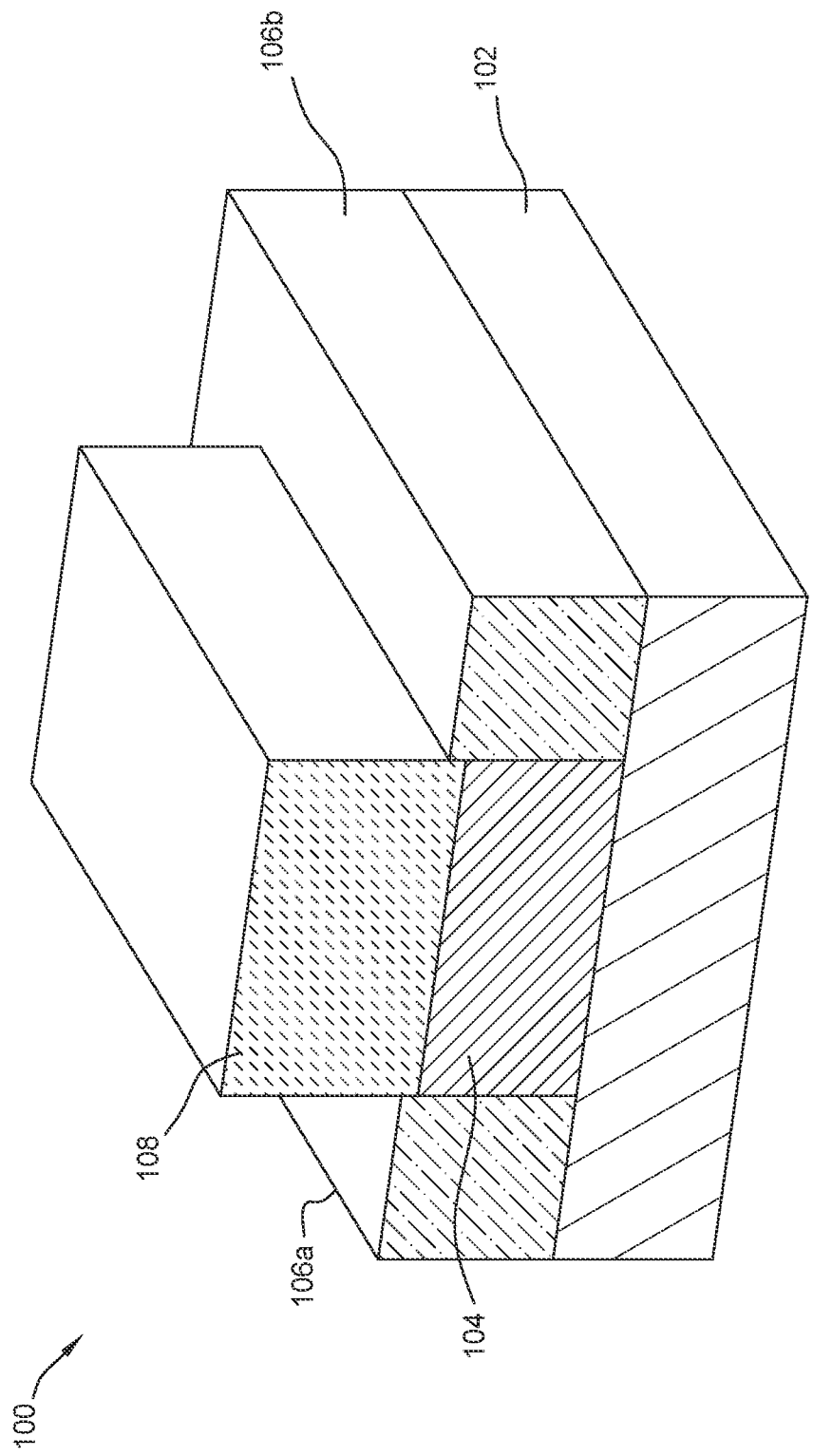
FIG. 1A is a cross-sectional view of an example SWIR detector according to at least one aspect of the present disclosure.

Aspects of the present disclosure generally relate to short-wave infrared (SWIR) materials, SWIR detectors, and methods of use. Conventional SWIR photodetectors are made of certain narrow band-gap semiconductors or quantum-well and quantum-dot structures based on Group III to V materials, such as InGaAs, HgCdTe, InSb, Pb Se, and various other materials. Graphene-based SWIR photodetectors have also been developed. Group III to V materials, however, require complex fabrication processes, while photodetectors using Group III to V materials typically require cryogenic operation. Graphene-based materials are limited by low light absorption and ultra-short photo-induced carrier lifetime.

Hybrid perovskite materials such as solution-processed organic-inorganic perovskite materials (for example, $MAPbI_3$, where MA is methylammonium, $CH_3NH_3^+$) have also been developed for their use in photodetectors. However, photodetector applications of conventional hybrid perovskite materials are limited to their wide bandgap. As a result, the conventional perovskite-based photodetectors are unable to transduce photons of SWIR light into electrical signals for subsequent processing, imaging reconstruction, and storage. These considerations have hindered the use of hybrid perovskite materials in SWIR photodetectors.

Aspects described herein can overcome such deficiencies in the state-of-the-art. As further described below, the compositions containing hybrid perovskite materials and detectors comprising such compositions have the ability to operate at room temperature unlike conventional Group III to V materials such as InGaAs. Such compositions and detectors are inexpensive and less complex to fabricate than traditional materials used for detectors. In addition, compositions containing hybrid perovskite materials and detectors comprising such compositions described herein show superior photoresponsivity in SWIR radiation. The compositions and detectors described herein can be used in myriad applications such as automobiles, remote sensing, vehicle control, automated inspection, identifying and sorting, surveillance, anti-counterfeiting, and environmental chemical analysis, among others.

Aspects described herein generally relate to SWIR materials. As further described herein, the SWIR material can be included in a device and/or a system that utilizes SWIR radiation (or light) for detecting, sensing, localizing, and/or imaging various objects. In some aspects, an SWIR material can be, or include, a composition of formula (I):

(I), wherein:
A is an organic group, an ion thereof (for example, an organic cation), or combinations thereof;
B is an organic group, an ion thereof (for example, an organic cation), an inorganic group, an ion thereof (for example, an inorganic cation), or combinations thereof, B being different from A;
M is a metal, an ion thereof (for example, a metal cation), or combinations thereof;
X is a halogen, an ion thereof (for example, a halogen anion);
a is the amount of A, b is the amount of B, c is the amount of M, d is the amount of X; and
each of a, b, c, and d are numbers that express the amounts or relative molar proportions of A, B, M, and X, respectively.

In some aspects the composition of formula (I) is a perovskite such as a hybrid perovskite. In some examples, the composition of formula (I) is a salt, a mixed salt, a mixed organic-inorganic metal salt, or combinations thereof.

A chemical "group" is described according to how that group is formally derived from a reference or "parent" compound, for example, by the number of hydrogen atoms formally removed from the parent compound to generate the group, even if that group is not literally synthesized in this manner. By way of example, an "alkyl group" can formally be derived by removing one hydrogen atom from an alkane, while an "alkylene group" can formally be derived by removing two hydrogen atoms from an alkane. Moreover, a more general term can be used to encompass a variety of groups that formally are derived by removing any number ("one or more") of hydrogen atoms from a parent compound, which in this example can be described as an "alkane group," and which encompasses an "alkyl group," an "alkylene group," and materials having three or more hydrogens atoms, as necessary for the situation, removed from the alkane. Throughout, the disclosure of a substituent, ligand, or other chemical moiety that can constitute a particular "group" implies that the well-known rules of chemical structure and bonding are followed when that group is employed as described. When describing a group as being "derived by," "derived from," "formed by," or "formed from," such terms are used in a formal sense and are not intended to reflect any specific synthetic methods or procedures, unless specified otherwise or the context requires otherwise.

The term "organic group" refers to a group that has at least one carbon atom. The organic group can also have one free valence at a carbon atom, for example a group formed by removing one or more hydrogen atoms from carbon atoms of an organic compound. Thus, an organic group" can contain carbon-containing groups such as hydrocarbyl groups. Organic groups can also contain functional group(s) and/or atom(s) other than carbon and hydrogen. For instance, non-limiting examples of atoms other than carbon and hydrogen include those atoms from Group 13 to Group 17 of the Periodic Table of the Elements such as B, Al, Si, Ge, N, P, O, S, halogens (F, Cl, Br, I), combinations thereof, among others. Non-limiting examples of functional groups include amines, hydroxyls, ethers, aldehydes, ketones, esters, sulfides, phosphines, and so forth. In one aspect, the hydrogen atom(s) removed to form the "organic group" can be attached to a carbon atom belonging to a functional group, for example, an acyl group (—C(O)R), a formyl group (—C(O)H), a carboxy group (—C(O)OH), a hydrocarboxycarbonyl group (—C(O)OR), a cyano group (—C≡N), a carbamoyl group (—C(O)NH$_2$), an N-hydrocarbylcarbamoyl group (—C(O)NHR), or an N,N'-dihydrocarbylcarbamoyl group (—C(O)NR$_2$), among other possibilities. In another aspect, the hydrogen atom(s) removed to form the "organic group" can be attached to a carbon atom not belonging to, and remote from, a functional group, for example, —CH$_2$C(O)CH$_3$, —CH$_2$NR$_2$, and the like. An organic group can be aliphatic, cyclic or acyclic, branched or unbranched, aromatic or non-aromatic. An organic group can also encompass heteroatom-containing rings, heteroatom-containing ring systems, heteroaromatic rings, and heteroaromatic ring systems.

The term "inorganic group" refers to any suitable group that lacks carbon atoms.

A of formula (I) can include a carbon atom and a nitrogen atom. The nitrogen atom may be protonated. In at least one aspect, A has a +1 charge. Illustrative, but non-limiting, examples, of A include methylamine, dimethylamine, trimethylamine, ethylamine, diethylamine, triethylamine, trisopropylamine, aziridine, diaziridine, formamidine, amidine, guanidine, methyl ammonium, dimethyl ammonium, trimethylammonium, ethylammonium, diethylammonium, triethylammonium, triisopropylammonium, aziridinium, diaziridinium, formamidinium, amidinium, guanidinium, and combinations thereof. Other organic groups or ions thereof (A) are contemplated.

B of formula (I) can include an organic group, an inorganic group, an ion thereof, or combinations thereof. In at least one aspect, B comprises a protic cation. In some aspects, B can comprise a nitrogen atom with a formal charge of +1. B can include a protonated nitrogen atom. B can be made by protonating a nitrogen-containing compound, such as an amine-containing compound, with an acid or other material. Examples of organic groups (or ions thereof) for B can include those described above for A, including, but not limited to methylamine, dimethylamine, trimethylamine, ethylamine, diethylamine, triethylamine, trisopropylamine, aziridine, diaziridine, formamidine, amidine, guanidine, methylammonium, dimethylammonium, trimethylammonium, ethylammonium, diethylammonium, triethylammonium, triisopropylammonium, aziridinium, diaziridinium, formamidinium, amidinium, guanidinium, and combinations thereof. Examples of inorganic groups (or ions thereof) for B include, but are not limited to, ammonia, hydrazine, ammonium, hydroxylammonium, hydrazinium, combinations thereof, as well as cations that are of similar size to the aforementioned organic groups, inorganic groups, ions thereof, and combinations thereof. Other inorganic groups or ions thereof for B are contemplated.

In some aspects, the composition of formula (I) includes an organic group or cation thereof for A and an inorganic group or cation thereof for B. In at least one aspect, the composition includes a first organic group or cation thereof for A and a second organic group or cation thereof for B, where A and B are the same or different. In at least one aspect, A is selected from those organic groups and organic cations A described above, such as selected from the group consisting of methylammonium and formamidinium. In some aspects, B can be methylammonium while A does not represent methylammonium. In some aspects, B is formamidinium and A is not formamidinium. Other combinations are contemplated.

M of formula (I) can include lead (Pb), tin (Sn), germanium (Ge), an ion thereof, or combinations thereof. M, in some aspects, has a charge of +2 or +4, though other values are contemplated. In some examples, M is $Pb^{2+}$, $Sn^{2+}$, $Ge^{4+}$, or combinations thereof.

X of formula (I) can be selected from the group consisting of fluorine (F), chlorine (Cl), bromine (Br), iodine (I), an ion thereof, and combinations thereof. The respective anions may be fluoride, chloride, bromide, and iodide, and combinations thereof. In some aspects, the composition of formula (I) can include multiple halogens or halogen anions, for example, where each of $X^1$, $X^2$, and $X^3$ are, independently, the same or different halogens or halogen anions.

In at least one aspect, the ratio of a, b, c, and d in the formula $A_aB_bM_cX_d$ can be represented as (a+b+2c=d). For the compositions, the molar ratios of the components are determined based on the starting material molar ratio used for the synthesis.

Compositions of the present disclosure can be mixed organic-inorganic metal salts. The formula of the organic-inorganic metal salt can depend on the method of making the salts, i.e., on the initial ratio between the various precursors of the mixed organic-inorganic metal salt. As an illustrative, but non-limiting, example, the mixed organic-inorganic metal salt of the formula $A_aB_bM_cX_d$ can be generated by mixing precursor materials such as precursor halides AX, BX, and MX in various ratios. In some aspects, the X is iodine, A and B are monocations of formula AI and BI, respectively, and M is a dication of formula $MI_2$. In these and other aspects, the mixed organic-inorganic metal salt may be prepared by mixing AI, BI, and $MI_2$. In some aspects, combinations of different halides can be used. For example, the halide can be iodine and chlorine, A and B are monocations of formula $AX^1$ and $BX^2$, respectively, and M is a dication of formula $MX^3$, where each of $X^1$, $X^2$, and $X^3$, are the same or different halides.

If, in a non-limiting example, the ratio between the salts is 0.5:0.5:1, the resulting salt is of the formula $A_{0.5}B_{0.5}MI_3$. Variations between ratios of the starting precursors and the formula of the resulting salt are possible. For example, even if the ratio of the precursors differs from 0.5:0.5:1, the formula of the resulting mixed organic-inorganic metal salt can still be $A_{0.5}B_{0.5}MI_3$. One of ordinary skill in the art would recognize that the formulas $A_{0.5}B_{0.5}MI_3$ and $A_1B_1M_2I_6$ represent the same material. The ratios referred to herein are generally understood to be, but not necessarily limited to, molar ratios.

In some aspects, a molar ratio of the components in formula (I) can be determined by the following formula:

$$(A_{1-x}B_{1-x})_nMX_3,$$

wherein:
A, B, M, and X are described above;
n is 1, 2, 3, or 4; and
x is from about 10% to about 90%, such as from about 20% to about 80%, such as from about 30% to about 70%, such as from about 40% to about 60%, such as from about 45% to about 55%, though other values or ranges are contemplated.

In some examples, A is methylammonium ($CH_3NH_3^+$), B is hydrazinium ($NH_2NH_3^+$), M is $Pb^{2+}$, and X is $I^-$. In these and other aspects, the ratio of A:B:M is 1:1:2 and the resulting mixed organic-inorganic metal salt can be represented by the formula $(CH_3NH_3)(NH_2NH_3)Pb_2I_6$.

Illustrative, but non-limiting, compositions of formula (I) include one or more of:

$(CH_3NH_3)_7(NH_2NH_3)Pb_4F_{16}$,
$(CH_3NH_3)_4(NH_2NH_3)_6Pb_5F_{20}$,
$(CH_3NH_3)_2(NH_2NH_3)_8Pb_5F_{20}$,
$(CH_3NH_3)(NH_3OH)PbF_4$,
$(CH_3NH_3)(NH_3OH)_3Pb_2F_8$, $(CH_3NH_3)(NH_2NH_3)PbF_4$,
$(CH_3NH_3)(NH_2NH_3)_3Pb_2F_8$,
$(CH_3NH_3)_7(NH_3OH)Pb_4F_{16}$,
$(CH_3NH_3)_4(NH_3OH)_6Pb_5F_{20}$,
$(CH_3NH_3)_2(NH_3OH)_8Pb_5F_{20}$,

-continued (CH$_3$NH$_3$)$_7$(NH$_2$=CHNH$_2$)Pb$_4$F$_{16}$,
(CH$_3$NH$_3$)$_4$(NH$_2$=CHNH$_2$)$_6$Pb$_5$F$_{20}$,
(CH$_3$NH$_3$)$_2$(NH$_2$=CHNH$_2$)$_8$Pb$_5$F$_{20}$,
(NH$_2$=CHNH$_2$)(NH$_2$NH$_3$)PbF$_4$,
(NH$_2$=CHNH$_2$)(NH$_2$NH$_3$)$_3$Pb$_2$F$_8$,
(NH$_2$=CHNH$_2$)$_7$(NH$_3$OH)Pb$_4$F$_{16}$,
(NH$_2$=CHNH$_2$)$_4$(NH$_3$OH)$_6$Pb$_5$F$_{20}$,
(NH$_2$=CHNH$_2$)$_2$(NH$_3$OH)$_8$Pb$_5$F$_{20}$,
(NH$_2$=CHNH$_2$)(CH$_3$NH$_3$)PbF$_4$,
(NH$_2$=CHNH$_2$)(CH$_3$NH$_3$)$_3$Pb$_2$F$_8$,
(CH$_3$NH$_3$)$_7$(NH$_2$NH$_3$)Pb$_4$Cl$_{16}$,
(CH$_3$NH$_3$)$_4$(NH$_2$NH$_3$)$_6$Pb$_5$Cl$_{20}$,
(CH$_3$NH$_3$)$_2$(NH$_2$NH$_3$)$_8$Pb$_5$Cl$_{20}$,
(CH$_3$NH$_3$)(NH$_3$OH)PbCl$_4$,
(CH$_3$NH$_3$)(NH$_3$OH)$_3$Pb$_2$Cl$_8$,
(CH$_3$NH$_3$)$_7$(NH$_2$=CHNH$_2$)Pb$_4$Cl$_{16}$,
(CH$_3$NH$_3$)$_4$(NH$_2$=CHNH$_2$)$_6$Pb$_5$Cl$_{20}$,
(CH$_3$NH$_3$)$_2$(NH$_2$=CHNH$_2$)$_8$Pb$_5$Cl$_{20}$,
(NH$_2$=CHNH$_2$)(NH$_2$NH$_3$)PbCl$_4$,
(NH$_2$=CHNH$_2$)(NH$_2$NH$_3$)$_3$Pb$_2$Cl$_8$,
(NH$_2$=CHNH$_2$)$_7$(NH$_3$OH)Pb$_4$Cl$_{16}$,
(NH$_2$=CHNH$_2$)$_4$(NH$_3$OH)$_6$Pb$_5$Cl$_{20}$,
(NH$_2$=CHNH$_2$)$_2$(NH$_3$OH)$_8$Pb$_5$Cl$_{20}$,
(NH$_2$=CHNH$_2$)(CH$_3$NH$_3$)PbCl$_4$,
(NH$_2$=CHNH$_2$)(CH$_3$NH$_3$)$_3$Pb$_2$Cl$_8$,
(CH$_3$NH$_3$)$_7$(NH$_2$NH$_3$)Pb$_4$Br$_{16}$,
(CH$_3$NH$_3$)$_4$(NH$_2$NH$_3$)$_6$Pb$_5$Br$_{20}$,
(CH$_3$NH$_3$)$_2$(NH$_2$NH$_3$)$_8$Pb$_5$Br$_{20}$,
(CH$_3$NH$_3$)(NH$_3$OH)PbBr$_4$,
(CH$_3$NH$_3$)(NH$_3$OH)$_3$Pb$_2$Br$_8$,
(CH$_3$NH$_3$)$_7$(NH$_2$=CHNH$_2$)Pb$_4$Br$_{16}$,
(CH$_3$NH$_3$)$_4$(NH$_2$=CHNH$_2$)$_6$Pb$_5$Br$_{20}$,
(CH$_3$NH$_3$)$_2$(NH$_2$=CHNH$_2$)$_8$Pb$_5$Br$_{20}$,
(NH$_2$=CHNH$_2$)(NH$_2$NH$_3$)PbBr$_4$,
(NH$_2$=CHNH$_2$)(NH$_2$NH$_3$)$_3$Pb$_2$Br$_8$,
(NH$_2$=CHNH$_2$)$_7$(NH$_3$OH)Pb$_4$Br$_{16}$,
(NH$_2$=CHNH$_2$)$_4$(NH$_3$OH)$_6$Pb$_5$Br$_0$,
(NH$_2$=CHNH$_2$)$_2$(NH$_3$OH)$_8$Pb$_5$Br$_{20}$,
(NH$_2$=CHNH$_2$)(CH$_3$NH$_3$)PbBr$_4$,
(NH$_2$=CHNH$_2$)(CH$_3$NH$_3$)$_3$Pb$_2$Br$_8$,
(CH$_3$NH$_3$)$_7$(NH$_2$NH$_3$)Pb$_4$I$_{16}$,
(CH$_3$NH$_3$)$_4$(NH$_2$NH$_3$)$_6$Pb$_5$I$_{20}$,
(CH$_3$NH$_3$)$_2$(NH$_2$NH$_3$)$_8$Pb$_5$I$_{20}$,
(CH$_3$NH$_3$)(NH$_3$OH)PbI$_4$,
(CH$_3$NH$_3$)(NH$_3$OH)$_3$Pb$_2$I$_8$,
(CH$_3$NH$_3$)$_7$(NH$_2$=CHNH$_2$)Pb$_4$I$_{16}$,
(CH$_3$NH$_3$)$_4$(NH$_2$=CHNH$_2$)$_6$Pb$_5$I$_{20}$,
(CH$_3$NH$_3$)$_2$(NH$_2$=CHNH$_2$)$_8$Pb$_5$I$_{20}$,
(NH$_2$=CHNH$_2$)(NH$_2$NH$_3$)PbI$_4$,
(NH$_2$=CHNH$_2$)(NH$_2$NH$_3$)$_3$Pb$_2$I$_8$,
(NH$_2$=CHNH$_2$)$_7$(NH$_3$OH)Pb$_4$I$_{16}$,
(NH$_2$=CHNH$_2$)$_4$(NH$_3$OH)$_6$Pb$_5$I$_{20}$,
(NH$_2$=CHNH$_2$)$_2$(NH$_3$OH)$_8$Pb$_5$I$_{20}$,
(NH$_2$=CHNH$_2$)(CH$_3$NH$_3$)PbI$_4$,
(NH$_2$=CHNH$_2$)(CH$_3$NH$_3$)$_3$Pb$_2$I$_8$,
(CH$_3$NH$_3$)(NH$_2$=CHNH$_2$)PbF$_4$,
(CH$_3$NH$_3$)(NH$_2$=CHNH$_2$)$_3$Pb$_2$F$_8$,
(NH$_2$=CHNH$_2$)$_7$(NH$_2$NH$_3$)Pb$_4$F$_{16}$,
(NH$_2$=CHNH$_2$)$_4$(NH$_2$NH$_3$)$_6$Pb$_5$F$_{20}$,
(NH$_2$=CHNH$_2$)$_2$(NH$_2$NH$_3$)$_8$Pb$_5$F$_{20}$,
(NH$_2$=CHNH$_2$)(NH$_3$OH)PbF$_4$,
(NH$_2$=CHNH$_2$)(NH$_3$OH)$_3$Pb$_2$F$_8$,
(NH$_2$=CHNH$_2$)$_7$(CH$_3$NH$_3$)Pb$_4$F$_{16}$,
(NH$_2$=CHNH$_2$)$_4$(CH$_3$NH$_3$)$_6$Pb$_5$F$_{20}$,
(NH$_2$=CHNH$_2$)$_2$(CH$_3$NH$_3$)$_8$Pb$_5$F$_{20}$,
(CH$_3$NH$_3$)(NH$_2$NH$_3$)PbCl$_4$,
(CH$_3$NH$_3$)(NH$_2$NH$_3$)$_3$Pb$_2$Cl$_8$,
(CH$_3$NH$_3$)$_7$(NH$_3$OH)Pb$_4$Cl$_{16}$,
(CH$_3$NH$_3$)$_4$(NH$_3$OH)$_6$Pb$_5$Cl$_{20}$,
(CH$_3$NH$_3$)$_2$(NH$_3$OH)$_8$Pb$_5$Cl$_{20}$,
(CH$_3$NH$_3$)(NH$_2$=CHNH$_2$)PbCl$_4$,
(CH$_3$NH$_3$)(NH$_2$=CHNH$_2$)$_3$Pb$_2$Cl$_8$,
(NH$_2$=CHNH$_2$)$_7$(NH$_2$NH$_3$)Pb$_4$Cl$_{16}$,
(NH$_2$=CHNH$_2$)$_4$(NH$_2$NH$_3$)$_6$Pb$_5$Cl$_{20}$,
(NH$_2$=CHNH$_2$)$_2$(NH$_2$NH$_3$)$_8$Pb$_5$Cl$_{20}$,
(NH$_2$=CHNH$_2$)(NH$_3$OH)PbCl$_4$,
(NH$_2$=CHNH$_2$)(NH$_3$OH)$_3$Pb$_2$Cl$_8$,
(NH$_2$=CHNH$_2$)$_7$(CH$_3$NH$_3$)Pb$_4$Cl$_{16}$,
(NH$_2$=CHNH$_2$)$_4$(CH$_3$NH$_3$)$_6$Pb$_5$Cl$_{20}$,
(NH$_2$=CHNH$_2$)2(CH$_3$NH$_3$)$_8$Pb$_5$Cl$_{20}$,
(CH$_3$NH$_3$)(NH$_2$NH$_3$)PbBr$_4$,
(CH$_3$NH$_3$)(NH$_2$NH$_3$)$_3$Pb$_2$Br$_8$,
(CH$_3$NH$_3$)$_7$(NH$_3$OH)Pb$_4$Br$_{16}$,
(CH$_3$NH$_3$)$_4$(NH$_3$OH)$_6$Pb$_5$Br$_{20}$,
(CH$_3$NH$_3$)$_2$(NH$_3$OH)$_8$Pb$_5$Br$_{20}$,
(CH$_3$NH$_3$)(NH$_2$=CHNH$_2$)PbBr$_4$,
(CH$_3$NH$_3$)(NH$_2$=CHNH$_2$)$_3$Pb$_2$Br$_8$,
(NH$_2$=CHNH$_2$)$_7$(NH$_2$NH$_3$)Pb$_4$Br$_{16}$,
(NH$_2$=CHNH$_2$)$_4$(NH$_2$NH$_3$)$_6$Pb$_5$Br$_{20}$,
(NH$_2$=CHNH$_2$)$_2$(NH$_2$NH$_3$)$_8$Pb$_5$Br$_{20}$,
(NH$_2$=CHNH$_2$)(NH$_3$OH)PbBr$_4$,
(NH$_2$=CHNH$_2$)(NH$_3$OH)$_3$Pb$_2$Br$_8$,
(NH$_2$=CHNH$_2$)$_7$(CH$_3$NH$_3$)Pb$_4$Br$_{16}$,
(NH$_2$=CHNH$_2$)$_4$(CH$_3$NH$_3$)$_6$Pb$_5$Br$_{20}$,
(NH$_2$=CHNH$_2$)$_2$(CH$_3$NH$_3$)$_8$Pb$_5$Br$_{20}$,
(CH$_3$NH$_3$)(NH$_2$NH$_3$)PbI$_4$,
(CH$_3$NH$_3$)(NH$_2$NH$_3$)$_3$Pb$_2$I$_8$,
(CH$_3$NH$_3$)$_7$(NH$_3$OH)Pb$_4$I$_{16}$,
(CH$_3$NH$_3$)$_4$(NH$_3$OH)$_6$Pb$_5$I$_{20}$,
(CH$_3$NH$_3$)$_2$(NH$_3$OH)$_8$Pb$_5$I$_{20}$,
(CH$_3$NH$_3$)(NH$_2$=CHNH$_2$)PbI$_4$,
(CH$_3$NH$_3$)(NH$_2$=CHNH$_2$)$_3$Pb$_2$I$_8$,
(NH$_2$=CHNH$_2$)$_7$(NH$_2$NH$_3$)Pb$_4$I$_{16}$,
(NH$_2$=CHNH$_2$)$_4$(NH$_2$NH$_3$)$_6$Pb$_5$I$_{20}$,
(NH$_2$=CHNH$_2$)$_2$(NH$_2$NH$_3$)$_8$Pb$_5$I$_{20}$,
(NH$_2$=CHNH$_2$)(NH$_3$OH)PbI$_4$,
(NH$_2$=CHNH$_2$)(NH$_3$OH)$_3$Pb$_2$I$_8$,
(NH$_2$=CHNH$_2$)$_7$(CH$_3$NH$_3$)Pb$_4$I$_{16}$,
(NH$_2$=CHNH$_2$)$_4$(CH$_3$NH$_3$)$_6$Pb$_5$I$_{20}$,
(NH$_2$=CHNH$_2$)$_2$(CH$_3$NH$_3$)$_8$Pb$_5$I$_{20}$, In some aspects, the compositions shown above can include a different A, a different B, a different M, a different M, or combinations thereof. Additionally, or alternatively, multiple halogens or ions thereof (for example, $X^1$, $X^2$, $X^3$, and so forth) can be the same or different halogen anions.

In some aspects, which can be combined with other aspects, the ratio of (A+B):M is 1:1. The number c of formula (I) can be 1, and the relationship between a and b can be defined as (a+b=1). Table 1 shows illustrative, but non-limiting, examples of compositions for which the ratios of A, B, and M of formula (I) of $A_aB_bM_cX_d$ can be represented as [(A+B):M=1:1]. These examples of compositions shown in Table 1 can be mixed organic-inorganic metal salts.

TABLE 1

| $A^+:B^+$ | Mixed salt formula |
|---|---|
| 0.875:0.125 | $A_{0.875}B_{0.125}MX_3$ |
| 1:1 | $A_{0.5}B_{0.5}MX_3$ |
| 0.4:0.6 | $A_{0.4}B_{0.6}MX_3$ |
| 0.25:0.75 | $A_{0.25}B_{0.75}MX_3$ |
| 0.2:0.8 | $A_{0.2}B_{0.8}MX_3$ |

In at least one aspect of formula (I), a+b=1 or b=1−a. Illustrative, but non-limiting, examples of such compositions can include $(NH_2=CHNH_2)_a(NH_2NH_3)_{1-a}PbF_3$, $(NH_2=CHNH_2)_a(NH_3OH)_{1-a}PbF_3$, $(CH_3NH_2)_a(NH_3OH)_{1-a}PbF_3$, $(CH_3NH_2)_a(NH_2=CHNH_2)_{1-a}PbF_3$, $(NH_2=CHNH_2)_a(NH_2NH_3)_{1-a}PbCl_3$, $(NH_2=CHNH_2)_a$ $(NH_3OH)_{1-a}PbCl_3$, $(CH_3NH_2)_a(NH_3OH)_{1-a}PbCl_3$, $(CH_3NH_2)_a(NH_2\!=\!CHNH_2)_{1-a}PbCl_3$, $(NH_2\!=\!CHNH_2)_a(NH_2NH_3)_{1-a}PbBr_3$, $(NH_2\!=\!CHNH_2)_a(NH_3OH)_{1-a}PbBr_3$, $(CH_3NH_2)_a(NH_3OH)_{1-a}BrI_3$, $(CH_3NH_2)_a(NH_2\!=\!CHNH_2)_{1-a}PbI_3$, $(NH_2\!=\!CHNH_2)_a(NH_2NH_3)_{1-a}PbI_3$, $(NH_2\!=\!CHNH_2)_a(NH_3OH)_{1-a}PbI_3$, $(CH_3NH_2)_a(NH_3OH)_{1-a}PbI_3$, and $(CH_3NH_2)_a(NH_2\!=\!CHNH_2)_{1-a}PbI_3$, or combinations thereof.

The composition can be crystalline, substantially crystalline, amorphous, or substantially amorphous. The composition can be in the form of a film, layer, a plurality of films, or plurality of layers, among other suitable structures. The size of the organic group (or ion thereof) and/or inorganic group (or ion thereof) represented by A and B can be estimated using their respective van der Waals radii. For example, and in some aspects, the van der Waals radii are from 100 pm to 500 pm, such as from 150 pm to 400 pm, such as from 150 pm to 300 pm, such as from 200 to 280 pm.

Properties of the composition can be altered by, for example, varying the amount or ratio of A, B, and/or M in the composition of formula (I). In some aspects, the amount of one or more precursors materials (for example precursor halides) used for the synthesis can be varied. Additionally, or alternatively, the ratio between A and B can be controlled or varied. In some aspects, the ratio between A and B can be varied in the preparation of the thin films by using various molar fractions of precursors (for example, salts) AX in the mixture of precursors (for example, salts) AX and BX, such as via the following relationship:

$$x_{AX}=[AX]/([AX]+[BX]),$$

wherein x represents the molar fraction of precursor salt AX and brackets indicate molarity, such as would be understood by one of skill in the art. In at least one aspect, the resulting mixed organic-inorganic metal salts can be represented by the empirical formula $A_xB_{1-x}Pb_cI_d$. One of ordinary skill in the art would understand that the empirical formula $A_xB_{1-x}Pb_cI_d$ is equivalent to the empirical formula $A_aB_{1-a}Pb_cI_d$ discussed herein.

In some aspects, the addition of A and B to a halide perovskite material, such as $MX_2$, results in a mixed organic-inorganic metal salt that exhibits strong and/or broad absorbance in the SWIR spectrum. This strong and broad absorbance can occurs in the SWIR range of about 800 nm to about 2500 nm when an inorganic cation such as $NH_2NH_3^+$ is added to a perovskite material, in addition to the typically high absorbance of halide perovskite in the visible region. In at least one aspect, the absorbance peaks can be located at about 1180 nm, about 1860 nm, about 1778 nm, about 1681 nm, and about 1600 nm for molar fractions of $x_{AX}$ equal to about 0.875, about 0.50, about 0.40, about 0.25, and about 0.20, respectively. In some aspects, the broadband SWIR peak shifts to a longer wavelength when $x_{AX}$ is lowered from a molar fraction of about 0.875 to a molar fraction of about 0.50. The broadband SWIR peak can shift to a shorter wavelength as the molar fraction $x_{AX}$ decreases from about 0.50 to about 0.20. The absorbance can exhibit a maximum peak at about 1860 nm at a molar fraction of $x_{AX}$ equal to about 0.50.

The X-ray diffraction (XRD) peaks of organic-inorganic-metal mixed salts described herein can be the same as, or similar to, those for the corresponding pure organo-metal perovskite, for example $APbI_3$ where A is $CH_3NH_3^+$, suggesting that the perovskite structures are not disrupted with the addition of an inorganic halide such as $NH_2NH_3I$. The hydrazinium cation ($NH_2NH_3^+$) can have the same molecular size as the methylammonium cation ($CH_3NH_3^+$), as evidenced in part by its van der Waals radius of about 217 pm. In some aspects, B, such as hydrazinium ($NH_2NH_3^+$), can fit into the space of four adjacent corner-sharing octahedral $PbI_6$ to produce a close-packed 3D structure. XRD analysis can be utilized to analyze the results of varying temperatures of substrates on the interaction of the resulting materials with short-wave IR. In some aspects, XRD peaks of $x_{AX}$=0.875 thin films can be located at about 14.04° (110) and about 28.3° (220). These peaks may be the same as those for pure perovskite $APbI_3$, where A=$CH_3NH_3$. In at least one aspect, the perovskite structures are not disrupted with the addition of the inorganic group, second organic group, or ion thereof B.

The compositions described herein are responsive to light (or radiation). The compositions described herein can be fabricated into a layer, a film, or other suitable structure. The layer or film of the composition can be made according to the following illustrative, but non-limiting, example. A first organic halide AX, an inorganic halide or a second organic halide BX, a metal halide $MX_2$, and a solvent are formed into a mixture. Any suitable method for mixing the precursor salts and/or solvents can be used. A substrate is heated at a suitable operating temperature such as from about 25° C. to about 300° C., such as from about 35° C. to about 200° C., such as from about 50° C. to about 130° C., such as from about 80° C. to about 120° C. The mixture is then disposed or deposited on the substrate. The operation of disposing or depositing the mixture on the substrate can include hot-casting the mixture on the substrate, spin coating the mixture onto the substrate, or combinations thereof. Other suitable techniques for disposing or depositing the mixture on the substrate are contemplated. In some non-limiting examples, the resulting layer or film can have a thickness that is from about 100 nm to 1000 nm, such as from about 125 nm to about 900 nm, such as from about 150 to about 800 nm, such as from about 200 nm to about 700 nm, such as from about 250 nm to about 600 nm, such as from about 300 nm to about 500 nm. Other thicknesses are contemplated.

Figure 1B:
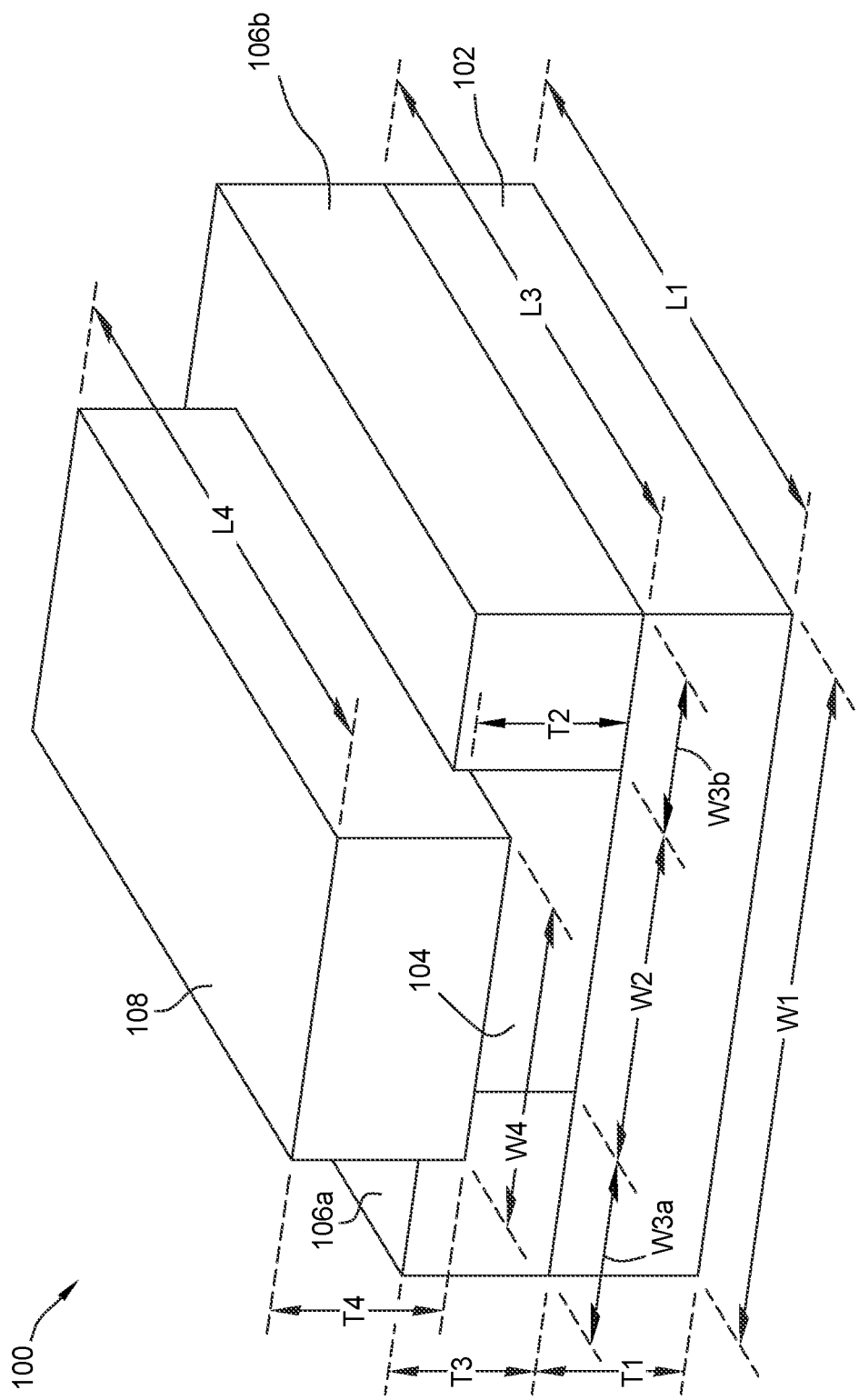
FIG. 1B is a schematic view of an example SWIR detector according to at least one aspect of the present disclosure.

FIG. 1A shows a cross-sectional view of an example configuration of a detector device 100 incorporating a composition described herein according to at least one aspect of the present disclosure. FIG. 1B shows the dimensions of various portions of the detector device 100. The detector device 100 is an example of a photodetector. The detector device 100 can be a sensor device. The detector device 100 can be configured to detect infrared radiation such as SWIR radiation. The detector device 100 can be operated at any suitable temperature, such as about 0° C. or higher, such as about 10° C. or higher, such as about ambient conditions (for example, from about 15° C. to about 25° C.), though higher or lower temperatures are contemplated. If desired, the device can work at cryogenic temperatures.

The detector device 100 is also referred to as a SWIR detector and an SWIR photodetector. The various layers shown in FIG. 1 can be deposited by suitable methods such as by spin coating, hot casting, or both.

The detector device 100 includes a substrate 102. The substrate 102 may be a wafer that includes glass, silicon, germanium, cadmium telluride (CdTe), cadmium zinc telluride (CdZnTe), gallium arsenside (GaAs), and combinations thereof. Other suitable substrate materials or combination of substrate materials are contemplated. Referring to FIG. 1B, the substrate 102 can have a thickness (T1) that is from about 50 nm to about 1 µm, such as from about 100 nm to about 800 nm, such as from about 200 nm to about 600 nm, though other thicknesses are contemplated. The width (W1) of the substrate 102 can be from about 10 µm to about 100 µm, such as from about 20 µm to about 80 µm, such as from about 40 µm to about 60 µm, though other widths are contemplated. The length (L1) of the substrate 102 can be from about 500 µm to about 3,000 µm, such as from about 1,000 µm to about 2,500 µm, such as from about 1,500 µm to about 2,000 µm, though other lengths are contemplated.

Referring back to FIG. 1A, a hole transport layer 104 (also known as a hole conducting material) is disposed over, or is adjacent to, at least a portion of the substrate 102. As used herein, the term "layer" includes layer, film, or other suitable structure. The hole transport layer 104 can include any suitable material such as polyacetylene, polyaniline, polypyrrole, polythiophene, derivatives thereof, or combinations thereof. Illustrative, but non-limiting, examples of the hole transport layer 104 can include poly(3,4-ethylenedioxythiophene) (PEDOT), poly(3,4-ethylenedioxythiophene) polystyrene sulfonate (PEDOT:PSS), poly(4,4-dioctylcyclopentadithiophene), poly(3-hexylthiophene) (P3HT), poly[bis(4-phenyl)(2,4,6-trimethylphenyl)amine (PTAA), derivatives thereof, or combinations thereof. In some aspects, the hole transport layer 104 can include, for example, spiro-MeO-TAD ($N^2$, $N^2$, $N^{2'}$, $N^{2'}$,$N^7$, $N^7$, $N^{7'}$,$N^{7'}$-octakis(4-methoxyphenyl)-9,9'-spirobi[9H-fluorene]-2,2',7,7'-tetramine; CAS No. 207739-72-8). In at least one aspect, inorganic materials can be used for at least a portion of the hole transport layer 104 such as copper-based materials (for example, $CuO_x$, CuSCN, CuI, among others), nickel-based materials (for example, $NiO_x$), and two-dimensional layered materials (for example, $MoS_2$, $WS_2$, among others). Combinations of one or more of the aforementioned materials can be used as at least a portion of the hole transport layer 104.

Referring to FIG. 1B, the hole transport layer 104 can have a thickness (T2) that is from about 10 nm to about 200 nm, such as from about 30 nm to about 150 nm, such as from about 40 nm to about 100 nm, though other thicknesses are contemplated. The width (W2) of the hole transport layer 104 can be from about 10 nm to about 200 nm, such as from about 30 nm to about 150 nm, such as from about 40 nm to about 100 nm, though other widths are contemplated. The length of the hole transport layer 104 can be from about 10 nm to about 200 nm, such as from about 30 nm to about 150 nm, such as from about 40 nm to about 100 nm, though other lengths are contemplated.

Referring back to FIG. 1A, one or more conductive layers 106a, 106b (collectively, conductive layer 106) is disposed over, or is adjacent to, at least a portion of the substrate 102. A portion of the conductive layer 106 can be disposed beside a portion of the hole transport layer 104 and/or around at least a portion of the hole transport layer 104. For example, the conductive layer 106 can be patterned to have a void or trench therein. Here, and in some examples, the conductive layer 106 can be disposed over (or be adjacent to) at least a first portion of a substrate 102, the conductive layer 106 having a void or trench therein; and the hole transport layer 104 can be disposed over (or be adjacent to) a second portion of the substrate 102, at least a portion of the hole transport layer 104 positioned within the void or trench of the conductive layer 106. The trench or void of the conductive layer 106 can have sidewalls and a bottom. The bottom of the trench or void can expose a portion of the substrate 102 upon which the hole transport layer 104 can be positioned. A portion of the hole transport layer 104 can be adjacent to the sidewalls of the trench or void of the conductive layer 106.

The conductive layer 106 can be optically transparent (or semi-transparent) and electrically conductive. The conductive layer 106 can be made of any suitable material such as oxides, polymers, metal grids, random metallic networks, carbon nanotubes, graphene, nanowire meshes, ultrathin metal films. These materials can be doped. The metals of such materials can be, for example, silver, copper, or a combination thereof.

Illustrative, but non-limiting, examples of conductive oxides that can be used as at least a portion of the conductive layer 106 can include indium tin oxide (ITO), fluorine doped tin oxide (FTO), doped zinc oxide (such as aluminum doped zinc oxide (AZO) and indium zinc oxide (IZO), indium-doped cadmium oxide, barium stannate (an oxide of barium and tin), strontium vanadate (an oxide of strontium and vanadium), calcium vanadate (an oxide of calcium and vanadium), or combinations thereof. Dopants for the conductive oxide can include fluorine, transition metals (for example, molybdenum, tantalum, among others), and combinations thereof. The conductive layer 106 be a film fabricated with polycrystalline or amorphous structures. The transparency of the conductive layer 106 can have a transmittance of incident light of about 70% or more, such as about 80% or more, though a higher or lower percent transmittance is contemplated. The conductive layer 106 can have an electrical conductivity of about $1\times10^3$ S/cm or more, though lower electrical conductivities are contemplated. The conductive layer 106 can be a n-type conductor. The conductive layer 106 can have a carrier concentration on the order of about $10^{18}$ cm$^{-3}$ or more, such as about $10^{20}$ cm$^{-3}$ or more.

Referring to FIG. 1B, the conductive layer 106 can have a thickness (T3) that is from about 10 nm to about 200 nm, such as from about 30 nm to about 150 nm, such as from about 40 nm to about 100 nm, though other thicknesses are contemplated. The width (W3a and W3b, individually) of the conductive layer 106 can be from about 10 µm to about 100 µm, such as from about 20 µm to about 80 µm, such as from about 30 µm to about 60 µm, though other widths are contemplated. The widths W3a and W3b can be the same or different. The length (L3) of the conductive layer 106 can be from about 500 µm to about 3,000 µm, such as from about 1,000 µm to about 2,500 µm, such as from about 1,500 µm to about 2,000 µm, though other lengths are contemplated. Conductive layers 106a, 106b can have the same or different dimensions.

Referring again to FIG. 1A, a light conversion layer 108 (or radiation conversion layer) is disposed over, or be adjacent to, at least a portion of the hole transport layer 104, the conductive layer 106, or both (as shown). The light conversion layer 108 is made of, or includes, one or more compositions of formula (I). The composition of formula (I), such as a hybrid perovskite, has energy bandgaps responsive to radiation in a spectral region (or waveband) of interest. The light conversion layer 108 can act as the absorber for at least one waveband (or range of wavebands). The light conversion layer 108 can also referred to as an SWIR layer or perovskite.

As shown in FIGS. 1A and 1B, at least a portion of the light conversion layer 108 can be disposed within the trench or void of the conductive layer 106. Alternatively, no portion of the light conversion layer 108 can be disposed within the trench or void of the conductive layer 106. In the latter case, the light conversion layer 108 can be disposed over, or be adjacent to, the hole transport layer 104, the conductive layer 106, or both.

Referring to FIG. 1B, the light conversion layer 108 can have a thickness (T4) that is from about 10 nm to about 500 nm, such as from about 50 nm to about 400 nm, such as from about 100 nm to about 350 nm, such as from about 150 nm to about 300 nm, such as from about 200 nm to about 250 nm, though other thicknesses are contemplated. The width (W4) of the light conversion layer 108 can be about 100 nm or more and/or about 100 µm or less, such as from about 1 µm to about 80 µm, such as from about 20 µm to about 60 µm, such as from about 30 µm to about 50 µm though other widths are contemplated. The length (L4) of the light conversion layer 108 can be from about 500 µm to about 3,000 µm, such as from about 1,000 µm to about 2,500 µm, such as from about 1,500 µm to about 2,000 µm, though other lengths are contemplated.

In some examples, the detector device has a horizontal configuration of FTO/PEDOT:PSS/perovskite/FTO. In some aspects, the detector device 100 is a photoconductive detector of the perovskite-based SWIR material (e.g., the composition). Such a unipolar photoconductor can extract a single hole carrier in p-type SWIR material. When SWIR light illuminates an active area of the perovskite-based material in the form of a film, the perovskite film absorbs photons to produce electron-hole pairs when a photon energy is greater than that of the SWIR bandgap. The photogenerated carriers can be subsequently separated under an external electric field and further collected by the opposite FTO electrode to generate a current.

The detector device 100, as an SWIR detector, can utilize SWIR light or radiation provided by natural sunlight and/or by an illuminator of appropriate color temperature. It can be used for imaging outdoors, in sunlight or in the shade, shadows, or darkness (for example, at night), as well as for imaging indoors. The detector device 100 can be configured to detect a single wavelength or a plurality of wavelengths in the infrared region, such as the SWIR region. In some examples, the detector device 100 can be used to detect radiation in the range of about 550 nm to about 2,700 nm, such as from about 900 nm to about 2,700 nm, such as from about 1,100 nm to about 2,500 nm, such as from about 1,300 nm to about 2,300 nm, such as from about 1,500 nm to about 2,100 nm, such as from about 1,700 nm to about 1,900 nm, though other wavelengths and wavelength ranges are contemplated. That is, the detector device 100 can be used to detect light or photons having a wavelength or wavelength range that is between about 550 nm and 2,700 nm, inclusive, such as about 900 nm to about 2,700 nm, such as from about 1,100 nm to about 2,500 nm, such as from about 1,300 nm to about 2,300 nm, such as from about 1,500 nm to about 2,100 nm, such as from about 1,700 nm to about 1,900 nm, though other wavelengths and wavelength ranges are contemplated.

In some aspects, the detector device 100 may correspond to a pixel of a larger detector or focal plane array. The detector device 100 can be used to detect SWIR radiation and can have reduced thermal noise and reduced dark current relative to conventional SWIR devices.

The SWIR detector (for example, detector device 100) can be utilized with, or otherwise incorporated into, various articles such as automobiles, other land vehicles (trucks), trains, aircraft, watercraft, satellite systems, mobile phones, imaging systems, surveillance systems, identification and sorting systems, security systems, among other articles. The articles can be hand-held. As such, the detector device 100 can be used to detect, sense, localize, and/or image various objects.

In some examples, the SWIR detector (for example, detector device 100) can be used to detect, sense, localize, and/or image a variety of objects such as vehicles, debris, gases, or other objects. While detection in other infrared spectral ranges (for example, mid-wave infrared light and long-wave infrared light) can rely on temperature differences, spectrally sensitive absorption detection using aspects described herein do not, and accordingly allows for objects to be detected even if the object is at a similar temperature as the background. Thus, aspects described herein do not need to rely on thermal contrast. In addition, interference from ambient conditions, such as ambient gases and water vapor are less significant in the SWIR region than in other spectral regions. This can allow for detection, sensing, localization, and imaging to be performed in humid air, steam, and fog, which would otherwise dramatically degrade the performance of or prohibit use of imaging in other infrared spectral ranges. That is, use of the SWIR bandwidth can render opaque or semi-opaque items transparent. The SWIR detector can also be used for the detection of gases such as hydrocarbon compounds, carbon dioxide, and ammonia. Non-gaseous states of compounds or elements can also be detected including liquids, emulsions, powders, and solids.

Further, aspects described herein can be utilized to examine the contents of an object such as a case or a pharmaceutical bottle without opening the object. Food products can be imaged or inspected using aspects described herein. For example, visible imaging of a food product such as an apple may show no discernable defect; however, defects such as bruising can be easily detected with SWIR imaging using aspects described herein.

Moreover, and in some aspects, the SWIR detector can be utilized without cryogenic cooling. Instead, the SWIR detector can be operated at room temperature (also referred to as ambient conditions) or can be operated with thermo-electric coolers (which can typically be operated at a temperature of about 4 K or more), representing a significant cost savings among other advantages.

Figure 1C:
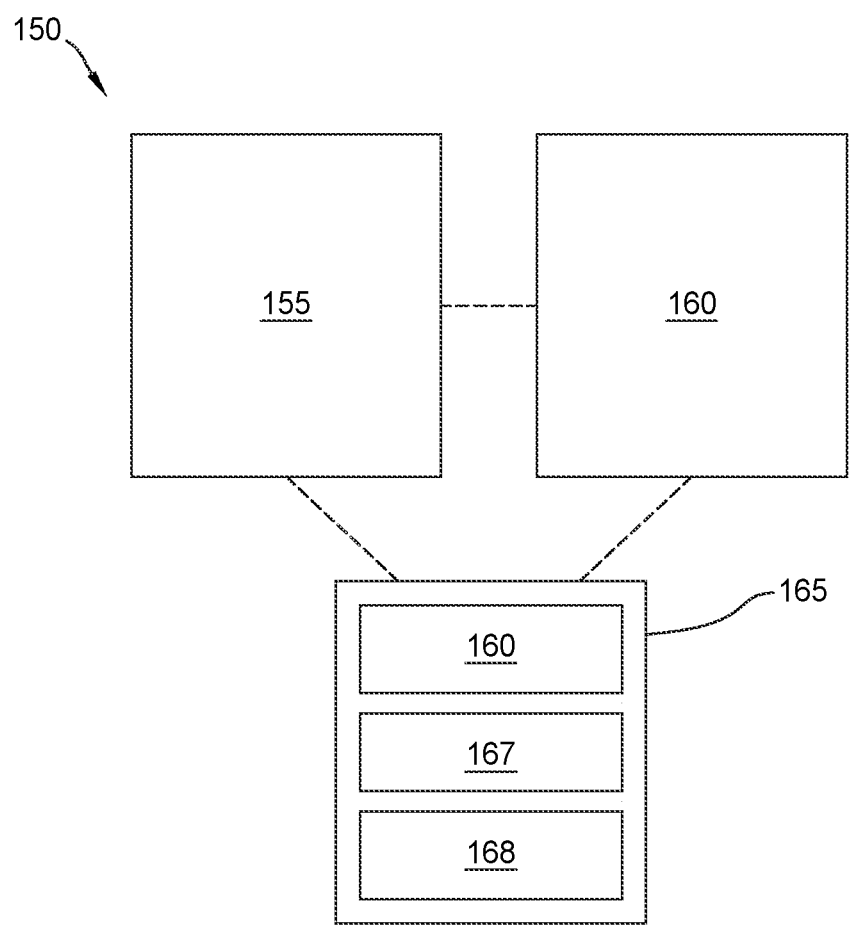
FIG. 1C is a block diagram of a system incorporating an SWIR detector according to at least one aspect of the present disclosure.

FIG. 1C is an illustration of a system 150 for be used to detect, sense, localize, and/or image an object or scene according to at least one aspect of the present disclosure. In some examples, the system 150 can be used to obtain an absorption image of an object or scene. In some examples, the system 150 can be used to detect an object or a scene and create an image of the object or the scene. The system 150 includes detection unit 155. The detection unit 155 is, or includes, the SWIR detector (for example, detector device 100). The detection unit 155 can utilize SWIR light or radiation provided by natural sunlight and/or by an illuminator of appropriate color temperature. It can be used for imaging outdoors, in sunlight or in the shade, shadows, or darkness (for example, at night), as well as for imaging indoors.

As shown in FIG. 1C, the system 150 can further include an illumination source 160. The illumination source 160 can be natural sunlight and or an artificial light source. The desired illumination can span the spectral region of about 550 nm to about 2.7 µm. Such an illumination is characteristic of, for example, a blackbody radiator at a temperature of about 1200° C. Such illumination can be efficiently generated using a carbon filament illuminator, which typically emits approximately 75 watts per inch of filament (sometimes coiled in a loose helical pattern). Other sources of short-wave infrared illumination include Xenon arc lamps. Other light sources with illumination in the desired spectral range might be used as well, such as tungsten filament. In certain aspects, the illumination source 160 comprises one or more emitters of light having wavelengths within the short-wave infrared spectral range. For example, the emitter may have a color temperature of about 1000° C.

to 1500° C. The emitter may, for example, be a carbon or tungsten filament. Other types of illumination source 160 are contemplated.

The system 150 can be used for both stationary applications, for example, where the system 150 is immobile, and dynamic applications, for example, where the system 150 is disposed on a vehicle, a cart, or in the form of a handheld device. The system 150 can be used for real-time imaging. For stationary applications, the illumination source 160 can be arranged around an object and can be used to partially or completely illuminate the object, and the detection unit 155 can be used to image the object. Here for example, objects can be placed near the stationary system and imaged. For the dynamic applications, the illumination source 160 may be transported together with the detection unit 155 around an object during an inspection, or mounted upon a vehicle together with the detection unit 155 so that it may be transported from site to site and operate while located on the vehicle (at rest, or while the vehicle is in motion).

In some aspects, the illumination source 160 can project SWIR illumination as a light beam, for example a structured light pattern or a structured beam of illumination. The illumination source 160 can project a vertical or radial light stripe of illumination that sweeps across an object or site for detecting or inspecting objects or a surface using a detector with a scan pattern synchronized to the sweeping motion of the projected stripe.

The system 150 may further include a controller 165. The controller 165 can be electrically coupled to the detection unit 155 and to the illumination source 160. The controller 165 can be configured to control one or more operations for obtaining an image of a scene or an image of an object such as vehicles, debris, gases, among others. Non-gaseous states of compounds or elements can also be detected including liquids, emulsions, powders, and solids.

The controller 165 includes at least one processor 166, a memory 167, and support circuits 168. The at least one processor 166 may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller.

The memory 167 is non-transitory and may be one or more of readily available memory such as random access memory (RAM), read only memory (ROM), or any other form of digital storage, local or remote. The memory 167 contains instructions, that when executed by the at least one processor 166, facilitates one or more operations of obtaining an image of an object or a scene. The instructions in the memory 167 are in the form of a program product such as a program that implements the method of the present disclosure. The program code of the program product may conform to any one of a number of different programming languages. Illustrative computer-readable storage media include, but are not limited to: (i) non-writable storage media (for example, read-only memory devices within a computer such as CD-ROM disks readable by a CD-ROM drive, flash memory, ROM chips, or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure. In one example, the disclosure may be implemented as the program product stored on a computer-readable storage media (for example, memory 167) for use with a computer system (not shown). The program(s) of the program product define functions of the disclosure, described herein.

The at least one processor 166, being associated with the detection unit 155 and the illumination source 160, can also be configured to process SWIR spectral data to create an absorption image. For example, the at least one processor 166 can be caused to retrieve and/or access data corresponding to detected light from a sample object or sample location, and use the data to create an image.

Aspects described herein also relate to methods of utilizing materials, devices, and systems described herein. In some aspects, the detector device 100 and/or the system 150 can be utilized in a method to detect, sense, localize, and/or image an object or a scene according to at least one aspect of the present disclosure. In the description of the method, "detect" is used. It should be understood that the method can be used to detect, sense, localize, and/or image an object or scene. Objects to be detected include, but are not limited to, vehicles, debris, gases, or other objects as described herein.

The method can include directing a light or radiation beam comprising SWIR light from an illumination source towards an object or a scene. The illumination source can be natural light, artificial light, or combinations thereof. Here, for example, at least a portion of an object or scene to be detected is illuminated with a light beam, such as a structured light beam, from an illumination source 160. The illuminated portions represent sampled locations of the object or scene. The method can further include detecting, with a detector, light or radiation that is absorbed and/or reflected by the object or scene. For example, the detector device 100 and/or detection unit 155 can be utilized to detect SWIR light or radiation absorbed and/or reflected from one or more sampled locations of the object or scene. Wavelengths in the SWIR band interact with the object or scene and photons/radiation in the SWIR band are absorbed and/or reflected by the object or scene. Such photons/radiation absorbed and/or reflected can be detected using the detector device 100 and/or detection unit 155.

During the method, the at least one processor 166 can be utilized to perform one or more operations of the method, such as directing the light beam toward one or more sampled locations of an object or scene and detecting light or radiation absorbed and/or reflected from the one or more sampled locations of the object or scene.

In some aspects, the method further includes taking an action based on the detected SWIR light or radiation. The action can be in the form of an alert or warning as to the presence of an object (for example, a vehicle, a gas, bruising of produce, a contaminant, etc.). Here, for example, the controller 165 (or processor thereof) can send a signal to, for example, an input/output device, such as a display unit or an audio device (not shown) indicating the presence of an object.

In some aspects, the method can further include creating an image such as an absorption image based on, for example, the short-wave infrared light absorbed or reflected by the sampled location(s) on the object. The image can additionally, or alternatively, be based on stored data. The at least one processor 166 can be utilized to create an image. For example, the at least one processor 166 can be configured to retrieve and/or access data corresponding to the detected SWIR light or radiation, and this data can be used by the at least one processor 166 to create an image of the object or the scene. For each of the sampled locations, the at least one processor 166 can determine, using the detected light at the sampled image locations, a corresponding level of absorption for each of one or more spectral bands to obtain an absorption image of the object or scene. The absorption image may be a multispectral absorption image which may include a plurality of pixels, each corresponding to a particular sampled image location and having one or more intensity values, each of the one or more intensity values based on a determined level of absorption at a particular spectral band of the one or more spectral bands.

The following examples are put forth so as to provide those of ordinary skill in the art with a complete disclosure and description of how to make and use aspects of the present disclosure, and are not intended to limit the scope of aspects of the present disclosure. Efforts have been made to ensure accuracy with respect to numbers used (for example, amounts, dimensions, etc.) but some experimental errors and deviations should be accounted for.

EXAMPLES

Various example, but non-limiting, SWIR photodetectors based on halide perovskite heterojunction materials according to some aspects described herein were prepared. In some examples, it was found that different doping iodide perovskites could be fabricated by changing the molar ratio of MAI to $PbI_2$. p-doping appears when the ratio is greater than 1, while n-doping occurs when the ratio is equal to or less than 1. Hydrazinium cations ($NH_2NH_3^+$, $HA^+$) were introduced into the halide perovskite to implement both p- and n-doping in $MAPbI_3$. $HA^+$ has a molecular size (R=217 pm), similar to that of methylammonium cation ($MA^+$). It partially substitutes $MA^+$ in the unit cell of the 3D structure as the main structure still remains because the $HA^+$ cation can fit the space of four adjacent corner-sharing octahedral $PbI_6$ to produce close-packed 3D structure.

Materials and Characterization Methods

Materials. Lead iodide ($PbI_2$, 99%), methylamine ($CH_3NH_2$, 33 wt % in ethanol), hydrazine (98%), and isopropanol (≥99.7%) were purchased from Sigma Aldrich. Lead chloride ($PbCl_2$, 99%) was purchased from Alfa Aesar. Hydroiodic acid (HI, 55-58% wt/wt aq. sol.), acetone (≥99.5%), and ethanol (75%) were purchased from Sinopharm.

Detector Device Performance Measurement. For SWIR photodetector performance, a 1310 nm laser source was used as the source with a tunable output by a neutral density filter and spot size of 0.95 $cm^2$. A Keithley 2401 source meter was used to apply bias voltages and record currents. A laser light (LPSC-1310-FC, Thorlabs, USA) was used to produce 1310 nm light. For the wavelength dependent measurements, a continuous wave (CW) light (SLS201, Thorlabs, USA) was used to produce 400 nm-1800 nm light. In addition, wavelength-dependent experiments were also carried out with a pulsed 100 kHz laser. The tunable SWIR pulsed sources were generated from an optical parametric amplifier (Light Conversion). A lens pair was used to focus the light on samples on a holder. All SWIR response characterization was directly conducted in air and under darkness to minimize interference from ambient light. The detector device was kept under dark conditions and placed in a shielding box to decrease environmental disturbance.

Example 1: Preparation of Compositions

Compositions of formula (I) were prepared by first making the precursors and then synthesizing the composition from the precursors.

Synthesis of methylammonium iodide. Methylammonium iodide ($CH_3NH_3I$, MAI) was synthesized by the reaction of hydroiodic acid and $CH_3NH_2$ at a temperature of about 0° C. by stirring for about 2 hours. The resultant mixture was evaporated at a temperature of about 60° C. under vacuum for about 1 hour. The precipitate was washed with diethyl ether (3x) and dried at 60° C. in a vacuum oven to yield $CH_3NH_3I$ (MAI) as a white powder.

Synthesis of hydrazine ammonium iodide. Hydrazine ammonium iodide ($NH_2NH_3I$, HAI) was synthesized by the reaction of hydroiodic acid and hydrazine at a temperature of about 0° C. The hydrazine solution diluted with ethanol (50%) was added into the hydroiodic acid solution slowly until a precipitate formed. The precipitate was recrystallized from cooled ethanol to yield $NH_2NH_3I$ (HAI) as a snow-white powder.

Preparation of compositions of formula (I) as thin films. A mixture of MAI, HAI, and $PbI_2$ was dissolved in anhydrous N,N-dimethylformamide (DMF). The total molarity of MAI and HAI was kept twice that of $PbI_2$. The concentration of $PbI_2$ was fixed at about 0.8 M, while the ratio of MAI to HAI was varied for desired molar fractions. The value of "x" in $[(MA)_{1-x}(HA)_xI]_2[PbI_2]_1$ is defined as the mole fraction of MAI in the mixture of MAI and HAI, where MA refers to methylamine and HA refers to hydrazine. The mixture solution of the precursors in DMF was kept constant at a temperature of about 70° C. during the whole process.

During spin coating, a hot substrate was quickly transferred to a spin coater chuck, and the mixture solution was dropped on the substrate by use of a pipette. The coating process was started immediately. The spin coater was programmed for acceleration to reach a speed of about 5000 rpm in about 2 seconds. After spinning for about 4 seconds, ether was poured on the surface of the substrate as an anti-solvent. The substrate was transferred to a hot plate and heated at a desired temperature (for example, about 120° C.) for a desired period (for example, about 15 minutes).

Example 2: Detector Device Fabrication

Different example detector devices were prepared using the compositions as thin films. The compositions had various ratios of cations (A, B, or both) to $PbI_2$ and different hydrazine ammonium iodide doping concentrations.

Cleaning the substrate. Pre-patterned fluorine-doped tin oxide (FTO) glasses as substrates were cleaned by ultrasonication with detergent for about 15 minutes using detergent, followed by washing with water, then deionized water, then acetone, then ethanol, and then deionized water, separately, in an ultrasonic bath for about 15 minutes each, and then dried with nitrogen gas. The FTO substrates were then subjected to an ultraviolet/$O_3$ (UVO) treatment for about 30 minutes.

Coating the substrate with a hole transport layer. Poly(3, 4-ethylenedioxythiophene) polystyrene sulfonate (PEDOT:PSS; Baytron PVP AI 4083) was used as the material for the hole transport layer. The hole transport layer, having a thickness of about 40 nm, was prepared by spin coating the substrate at about 4500 rpm for about 40 seconds, followed by annealing in air at a temperature of about 145° C. for about 20 minutes. After cooling to about room temperature, the samples were transferred into a glovebox for SWIR perovskite thin-film depositions.

Deposition of the SWIR thin films. Various different thin films of example compositions, having various ratios of cations (A, B, or both) to $PbI_2$ and different HAI doping concentrations were coated onto the hole transport layer by spin coating. Electrode contacts were exposed by removing the covered PEDOT:PSS and thin film (comprising the SWIR material).

An example of the formed detector device 100 is shown in FIGS. 1A and 1B. The device includes FTO glass pre-patterned as two contacts (e.g., conductive layers 106a, 106b) with an active area of about 50 μm wide by about 1000 μm deep. The thickness of the SWIR layer (which is, or is part of, the light conversion layer 108) is about 300±20 nm. Underneath, PEDOT:PSS is used as the hole transport layer 104. As such, a horizontal configuration of FTO/PEDOT:PSS/perovskite/FTO is fabricated as shown in FIGS. 1A and 1B. The detector device 100 is a photoconductive detector of the perovskite-based SWIR material laid out with a co-planar interdigitated patterned as schematically presented in FIGS. 1A and 1B.

For the following investigations, the example SWIR photodetector incorporates a composition of formula (I). The composition of formula (I) is a perovskite having about 16.5% HA$^+$ and about 83.5% MA$^+$.

Figure 2:
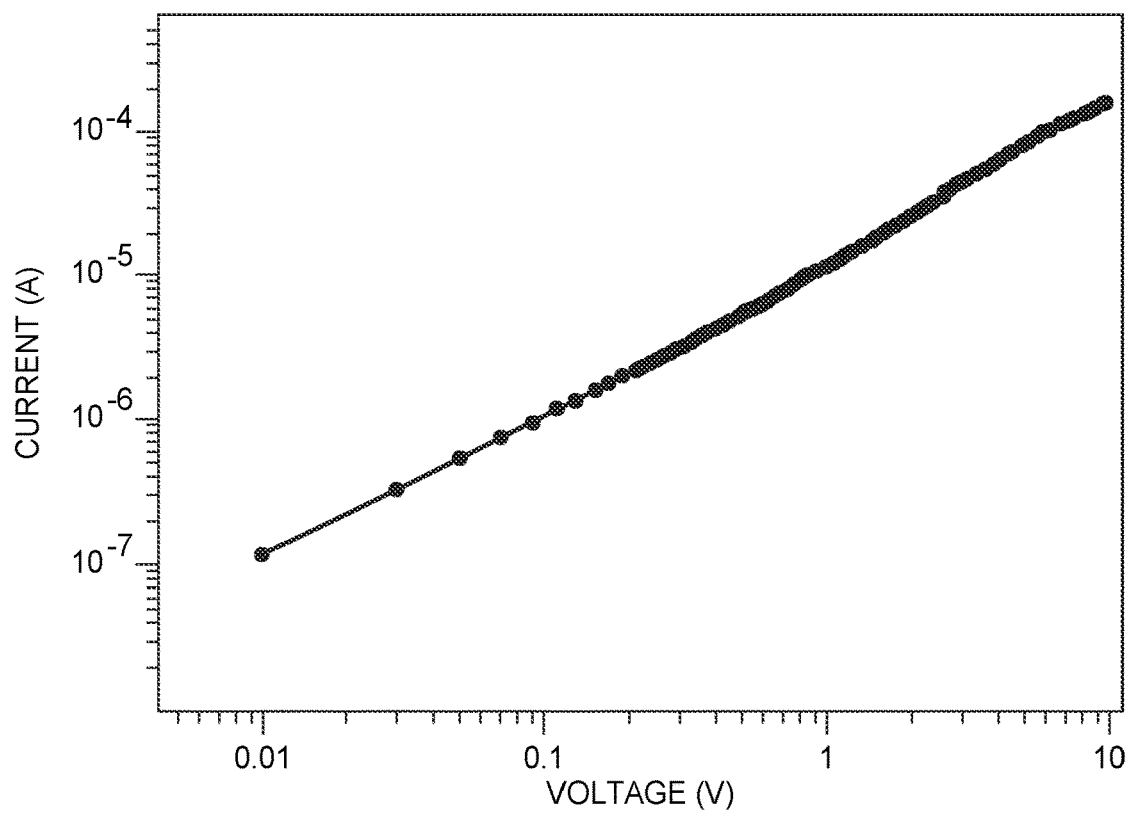
FIG. 2 shows exemplary dark current-voltage (J-V) measurements using an example SWIR photodetector according to at least one aspect of the present disclosure.

Space charge limited current (SCLC) was utilized to measure the properties of charge carrier traps in the halide perovskites. FIG. 2 shows exemplary dark current-voltage (J-V) measurements using an example SWIR photodetector. Measuring dark J-V curves enables calculation of transport parameters of the halide perovskite. The carrier mobility was determined to be about $1.76 \times 10^{-2}$ cm$^2$V$^{-1}$s$^{-1}$ using the SCLC method which is at least comparable to commercial photodetectors under the conditions tested.

Figure 3:
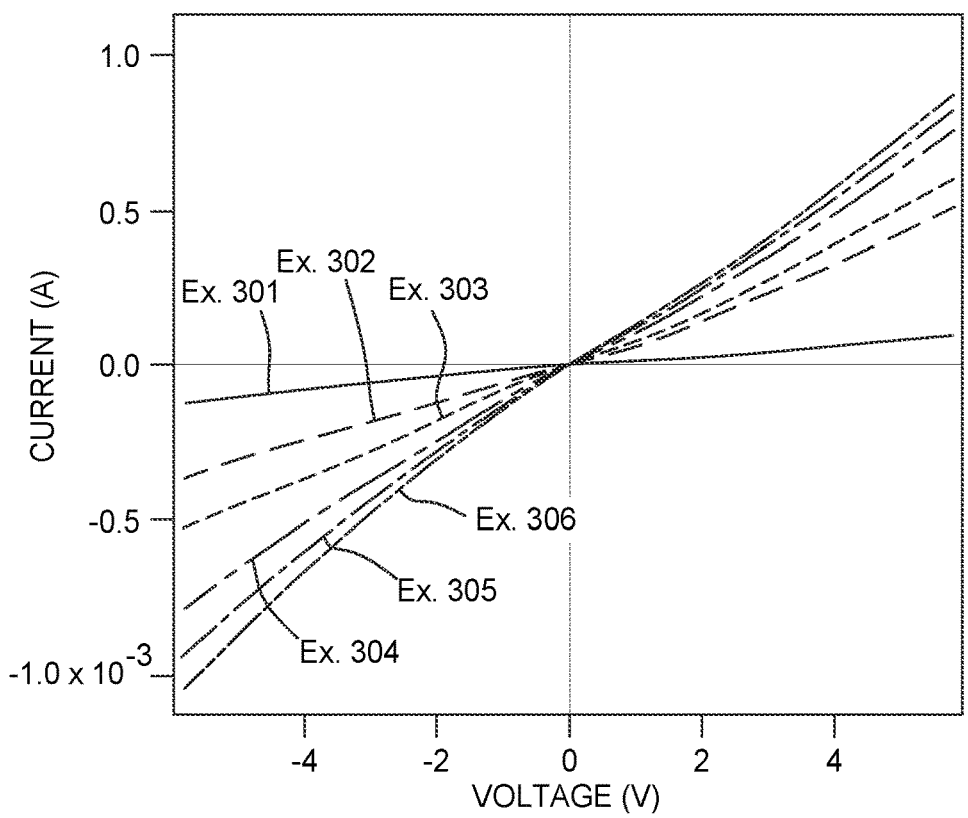
FIG. 3 shows exemplary current-voltage curves under different light intensities for an example SWIR photodetector according to at least one aspect of the present disclosure.

FIG. 3 shows exemplary current-voltage curves for an example SWIR photodetector (16.5% HA$^+$). Specifically, photocurrent versus applied voltage curves were collected using a 1310 nm laser source under different light intensities (in units of milliwatt per square centimeter, mW·cm$^2$) of about 0 mW·cm$^{-2}$ (Ex. 301), about 0.042 mW·cm$^{-2}$ (Ex. 302), about 0.263 mW·cm$^2$ (Ex. 303), about 0.526 mW·cm$^{-2}$ (Ex. 304), about 12.6 mW·cm$^{-2}$ (Ex. 305), and about 47.4 mW·cm$^{-2}$ (Ex. 306). The data shown in FIG. 3 was collected at ambient conditions. The data of FIG. 3 indicated that the detector device produced significant photocurrent output at room temperature. For example, the photocurrent (in units of amps, A) from the detector device was measured to be about $1.1 \times 10^{-4}$ A under a bias voltage of about −5.8 Volts (V) for the tested wavelength.

Figure 4:
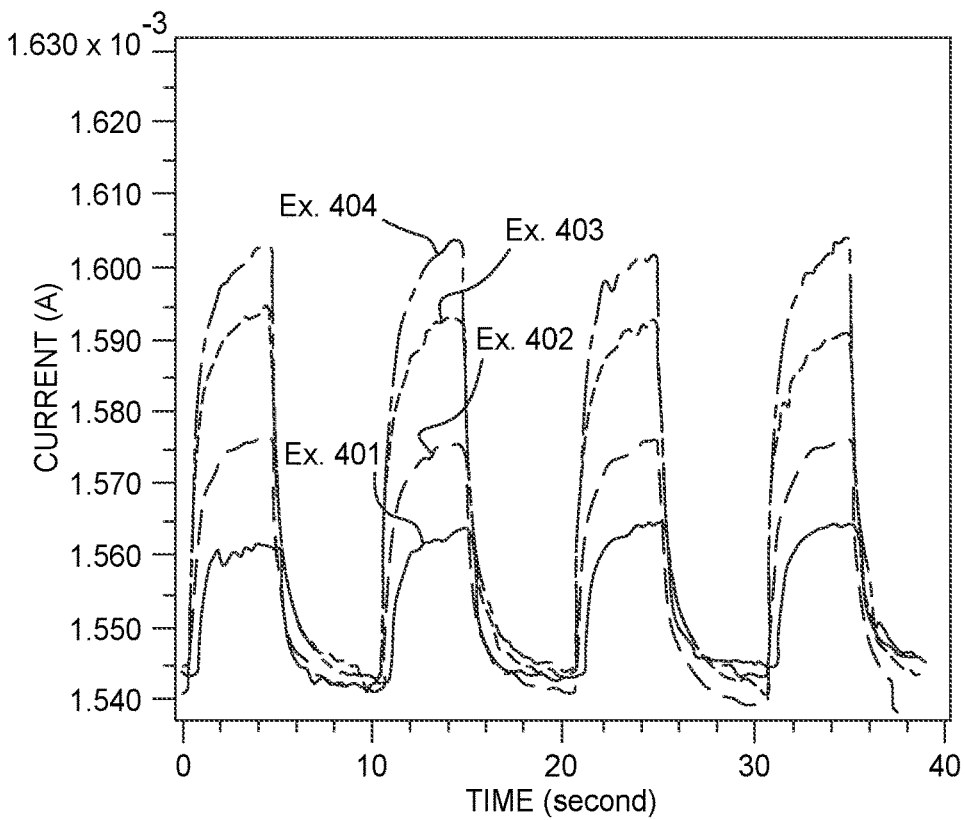
FIG. 4 shows exemplary current-time curves, with SWIR light on and off, under different light intensities for an example SWIR photodetector according to at least one aspect of the present disclosure.

FIG. 4 shows exemplary current-time curves for an example SWIR photodetector (16.5% HA$^+$). The photocurrent responses of the light with SWIR light on and off, under different light intensities were collected using a 1310 nm laser source. The data was collected under ambient conditions. The light intensities used included 20 mW·cm$^{-2}$ (Ex. 401), about 28 mW·cm$^{-2}$ (Ex. 402), about 38 mW·cm$^{-2}$ (Ex. 403), and about 50 mW·cm$^{-2}$ (Ex. 404). The data shown in FIG. 4 indicated that the SWIR photocurrents exhibit significant difference under the illumination of the light from those in the dark, suggesting that the responses from the materials is significant.

Figure 5:
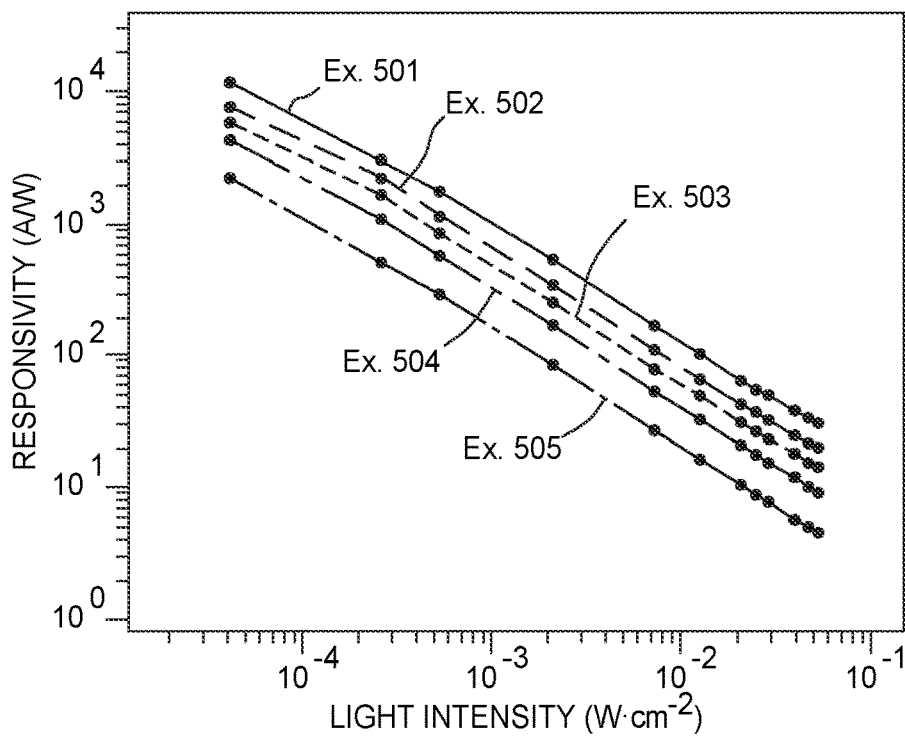
FIG. 5 shows exemplary data for the responsivity as a function of light intensity of an example SWIR photodetector according to at least one aspect of the present disclosure.

FIG. 5 shows exemplary data for the responsivity example SWIR photodetector (16.5% HA$^+$) as a function of light intensity. A variety of applied voltages were utilized and included about −5.8 V (Ex. 501), about −4 V (Ex. 502), about −3 V (Ex. 503), about −2 V (Ex. 504), and about −1 V (Ex. 505). The data was collected under ambient conditions. Under the conditions tested, the responsivity, in units of amps/watt (A/W), was determined to be as high about $1.2 \times 10^{-4}$ A/W under a low light intensity of about 4.2 low light intensity of about 42 μW/cm$^2$ at 1310 nm under −5.8 V bias. The SWIR currents also showed a linear dependence on the applied voltage, indicating that a higher responsivity could be readily reached by applying a larger bias voltage. The responsivity of the example SWIR photodetector is comparable, or even improved, over commercial photodetectors such as Ge, PbS, InGaAs.

Figure 6:
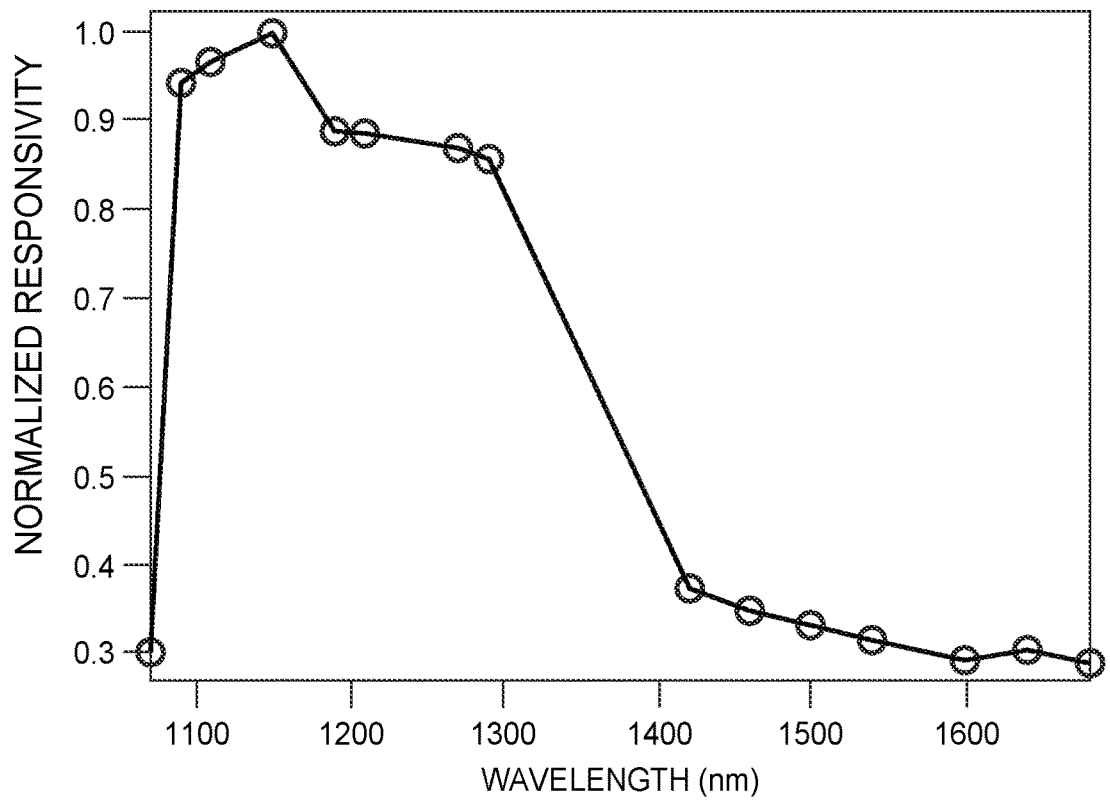
FIG. 6 shows exemplary data for the wavelength-dependent photoresponsivity of an example SWIR photodetector according to at least one aspect of the present disclosure.

FIG. 6 shows exemplary data for the normalized wavelength-dependent photoresponsivity of an example SWIR photodetector (16.5% HA$^+$) at a wavelength of 1310 nm. The data was collected under ambient conditions. The SWIR responses were determined to be broad, indicating that the photodetector is better than commercial photodetectors.

Figure 7:
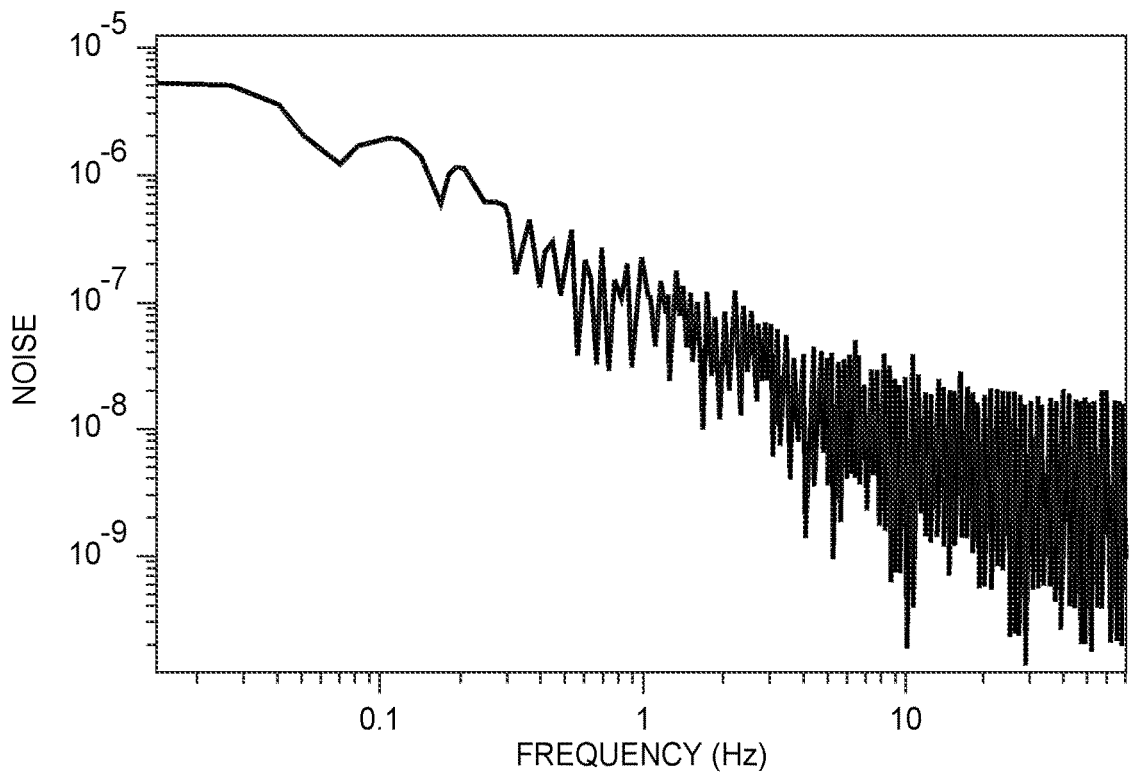
FIG. 7 shows exemplary data of noise measurement for specific detectivity of an example SWIR photodetector according to at least one aspect of the present disclosure.

FIG. 7 shows exemplary data of noise measurement for specific detectivity of an example SWIR photodetector (16.5% HA$^+$). The data was collected under ambient conditions. The specific detectivity is utilized to characterize a photodetector's sensitivity characterized by the ability of a photodetector device to probe weak light. The specific detectivity was calculated to be about $1.58 \times 10^8$ cmHz$^{1/2}$W$^{-1}$, which is at least comparable to commercial photodetectors under the conditions tested.

Overall, the data indicates that SWIR materials and detectors incorporating such materials, have high responsivity and broad responses in the SWIR range.

Aspects of the present disclosure generally relate to SWIR materials, SWIR detectors, and methods of use. The SWIR materials described herein, such as the hybrid perovskite containing compositions, can be incorporated into devices for detecting SWIR light or radiation. Unlike conventional detectors, the SWIR detector devices described herein can operate at room temperature and have high photoresponsivity. Further, relative to conventional detectors, the SWIR detector devices described herein can be less complex and less costly to fabricate. Aspects described herein can find applications in automobiles, remote sensing, vehicle control, automated inspection, identifying and sorting, surveillance, anti-counterfeiting, and environmental chemical analysis, among other applications.

ASPECTS LISTING

The present disclosure provides, among others, the following aspects, each of which can be considered as optionally including any alternate aspects:

Clause 1. A short-wave infrared detector, comprising:
a conductive layer disposed over a first portion of a substrate, the conductive layer having a trench therein;
a hole transport layer disposed over at least a second portion of the substrate, at least a portion of the hole transport layer positioned within the trench of the conductive layer;
a light conversion layer disposed over at least a portion of the hole transport layer, the light conversion layer comprising a composition of formula (I):

$$A_aB_bM_cX_d \quad (I),$$

wherein:
A is an organic group or ion thereof;
B is an organic group, an inorganic group, or ion thereof, A and B being the same or different;
M is a metal or ion thereof;
X is a halogen or ion thereof; and
a, b, c, and d are numbers expressing amounts of A, B, M, and X.

Clause 2. The short-wave infrared detector of Clause 1, wherein M is Pb, Sn, Ge, or ion thereof.

Clause 3. The short-wave infrared detector of Clause 1 or Clause 2, wherein A is selected from the group consisting of methylamine, dimethylamine, trimethylamine, ethylamine, diethylamine, triethylamine, trisopropylamine, aziridine, diaziridine, formamidine, amidine, guanidine, methylammonium, dimethylammonium, trimethylammonium, ethylammonium, diethylammonium, triethylammonium, triisopropylammonium, aziridinium, diaziridinium, formamidinium, amidinium, guanidinium, and combinations thereof.

Clause 4. The short-wave infrared detector of any one of Clauses 1-3, wherein B is selected from the group consisting of ammonia, hydrazine, ammonium, hydroxylammonium, hydrazinium, and combinations thereof.

Clause 5. The short-wave infrared detector of any one of Clauses 1-4, wherein the short-wave infrared detector is configured to operate at a temperature of about 10° C. or higher.

Clause 6. The short-wave infrared detector of any one of Clauses 1-5, wherein:
A is methylammonium or formamidinium; and
B is methylammonium, formamidinium, hydrazinium, or hydroxylammonium.

Clause 7. The short-wave infrared detector of any one of Clauses 1-6, wherein a is a non-zero number, b is 1—a, and d is 3.

Clause 8. The short-wave infrared detector of Clause 7, wherein a is from about 0.2 to about 0.9.

Clause 9. The short-wave infrared detector of Clause 7, wherein a is from about 0.2 to about 0.25, or from about 0.25 to about 0.3, or from about 0.3 to about 0.4, or from about 0.4 to about 0.5, or from about 0.5 to about 0.6, or from about 0.6 to about 0.7, or from about 0.7 to about 0.8, or from about 0.8 to about 0.9.

Clause 10. The short-wave infrared detector of any one of Clauses 1-9, wherein the light conversion layer has a thickness of about 200 nm to about 800 nm.

Clause 11. The short-wave infrared detector of any one of Clauses 1-10, wherein:
the conductive layer comprises a conductive oxide; and
the hole transport layer comprises polyacetylene, polyaniline, polypyrrole, polythiophene, derivatives thereof, or combinations thereof.

Clause 12. The short-wave infrared detector of any one of Clauses 1-11, wherein:
the conductive layer comprises indium tin oxide (ITO), fluorine doped tin oxide (FTO), aluminum doped zinc oxide, indium zinc oxide (IZO), indium-doped cadmium oxide, barium stannate, strontium vanadate, calcium vanadate, or combinations thereof; and
the hole transport layer comprises poly(3,4-ethylenedioxythiophene) (PEDOT), poly(3,4-ethylenedioxythiophene) polystyrene sulfonate (PEDOT:PSS), poly(4,4-dioctylcyclopentadithiophene), or combinations thereof.

Clause 13. A short-wave infrared detection system, comprising:
at least one processor;
an illumination source configured to illuminate a sampled location of an object or a scene; and
a detector configured to detect light from the sampled location, the detector comprising a light conversion layer, the light conversion layer comprising a composition of formula (I):

$$A_aB_bM_cX_d \quad (I),$$

wherein:
A is an organic group or ion thereof;
B is an organic group, an inorganic group, or ion thereof, B and A being the same or different;
M is a metal or ion thereof;
X is a halogen or ion thereof; and
a, b, c, and d are numbers expressing amounts of A, B, M, and D.

Clause 14. The short-wave infrared detection system of Clause 13, wherein the at least one processor is configured to create an absorption image of the object or the scene.

Clause 15. The short-wave infrared detection system of Clause 13 or Clause 14, further comprising:
a conductive layer having a trench therein; and
a hole transport layer, at least a portion of the hole transport layer positioned within the trench of the conductive layer, the light conversion layer disposed over the hole transport layer.

Clause 16. The short-wave infrared detection system of Clause 15, wherein:
the hole transport layer comprises polyacetylene, polyaniline, polypyrrole, polythiophene, derivatives thereof, or combinations thereof; and
the conductive layer comprises a conductive oxide.

Clause 17. The short-wave infrared detection system of any one of Clauses 13-16, wherein:
M is Pb, Sn, Ge, or ion thereof;
A is selected from the group consisting of methylamine, dimethylamine, trimethylamine, ethylamine, diethylamine, triethylamine, trisopropylamine, aziridine, diaziridine, formamidine, amidine, guanidine, methylammonium, dimethylammonium, trimethylammonium, ethylammonium, diethylammonium, triethylammonium, triisopropylammonium, aziridinium, diaziridinium, formamidinium, amidinium, guanidinium, and combinations thereof; or
combinations thereof.

Clause 18. A method, comprising:
directing a light beam comprising short-wave infrared light from an illumination source towards an object and illuminating a sampled location on the object; and
detecting, by a detector, light absorbed or reflected by the sampled location on the object, the detector comprising a light conversion layer, the light conversion layer comprising a composition of formula (I):

$$A_aB_bM_cX_d \quad (I),$$

wherein:
A is an organic group or ion thereof;
B is an organic group, an inorganic group, or ion thereof, B and A being the same or different;
M is a metal or ion thereof;
X is a halogen or ion thereof; and
a, b, c, and d are numbers expressing amounts of A, B, M, and D.

Clause 19. The method of Clause 18, further comprising creating an image based on the detected light.

Clause 20. The method of Clause 18 or Clause 19, wherein:
the light conversion layer has a thickness from about 200 nm to about 800 nm; and
the detector further comprises:
a conductive layer having a trench therein; and
a hole transport layer, at least a portion of the hole transport layer positioned within the trench of the conductive layer, the composition disposed over the hole transport layer.

As is apparent from the foregoing general description and the specific aspects, while forms of the aspects have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "Is" preceding the recitation of the composition, element, or elements and vice versa, for example, the terms "comprising," "consisting essentially of," "consisting of" also include the product of the combinations of elements listed after the term.

The use of headings is for purposes of convenience only and does not limit the scope of the present disclosure.

Where isomers of a named molecule group exist (for example, n-butyl, iso-butyl, sec-butyl, and tert-butyl), reference to one member of the group (for example, n-butyl) shall expressly disclose the remaining isomers (for example, iso-butyl, sec-butyl, and tert-butyl) in the family. Likewise, reference to a named molecule without specifying a particular isomer (for example, butyl) expressly discloses all isomers (for example, n-butyl, iso-butyl, sec-butyl, and tert-butyl).

As used herein, a "composition" can include component(s) of the composition, reaction product(s) of two or more components of the composition, and/or a remainder balance of remaining starting component(s), or combinations thereof. Compositions of the present disclosure can be prepared by any suitable mixing process.

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the term "about" when referring to a measurable value such as an amount, a temporal duration, and the like, is meant to encompass variations of ±20%, ±15, ±10%, ±5%, ±1%, or ±0.1% from the specified value, as such variations are appropriate.

As used herein, the indefinite article "a" or "an" shall mean "at least one" unless specified to the contrary or the context clearly indicates otherwise. For example, aspects comprising "a metal" include aspects comprising one, two, or more metals, unless specified to the contrary or the context clearly indicates only one metal is included.

While the foregoing is directed to aspects of the present disclosure, other and further aspects of the disclosure may be devised without departing from the basic scope thereof, and the scope thereof is determined by the claims that follow.

What is claimed is:

1. A short-wave infrared detector, comprising:
a conductive layer disposed over a first portion of a substrate, the conductive layer having a trench therein;
a hole transport layer disposed over at least a second portion of the substrate, at least a portion of the hole transport layer positioned within the trench of the conductive layer;
a light conversion layer disposed over at least a portion of the hole transport layer, the light conversion layer comprising a composition of formula (I):

$$A_a B_b M_c X_d \qquad (I),$$

wherein:
A of formula (I) is an organic group or ion thereof;
B of formula (I) is an organic group, an inorganic group, or ion thereof, A and B being the same or different;
M of formula (I) is a metal or ion thereof;
X of formula (I) is a halogen or ion thereof; and
a, b, c, and d of formula (I) are numbers expressing amounts of A, B, M, and X.

2. The short-wave infrared detector of claim 1, wherein a of formula (I) is a non-zero number, b of formula (I) is 1–a, and d of formula (I) is 3.

3. The short-wave infrared detector of claim 2, wherein a of formula (I) is from about 0.2 to about 0.9.

4. The short-wave infrared detector of claim 2, wherein a of formula (I) is from about 0.2 to about 0.25, or from about 0.25 to about 0.3, or from about 0.3 to about 0.4, or from about 0.4 to about 0.5, or from about 0.5 to about 0.6, or from about 0.6 to about 0.7, or from about 0.7 to about 0.8, or from about 0.8 to about 0.9.

5. The short-wave infrared detector of claim 1, wherein M of formula (I) is Pb, Sn, Ge, or ion thereof.

6. The short-wave infrared detector of claim 1, wherein A of formula (I) is selected from the group consisting of methylamine, dimethylamine, trimethylamine, ethylamine, diethylamine, triethylamine, trisopropylamine, aziridine, diaziridine, formamidine, amidine, guanidine, methylammonium, dimethylammonium, trimethylammonium, ethylammonium, diethylammonium, triethylammonium, triisopropylammonium, aziridinium, diaziridinium, formamidinium, amidinium, guanidinium, and combinations thereof.

7. The short-wave infrared detector of claim 1, wherein B of formula (I) is selected from the group consisting of ammonia, hydrazine, ammonium, hydroxylammonium, hydrazinium, and combinations thereof.

8. The short-wave infrared detector of claim 1, wherein the short-wave infrared detector is configured to operate at a temperature of about 10° C. or higher.

9. The short-wave infrared detector of claim 1, wherein:
A of formula (I) is methylammonium or formamidinium; and
B of formula (I) is methylammonium, formamidinium, hydrazinium, or hydroxylammonium.

10. The short-wave infrared detector of claim 1, wherein the light conversion layer has a thickness of about 200 nm to about 800 nm.

11. The short-wave infrared detector of claim 1, wherein:
the conductive layer comprises a conductive oxide; and
the hole transport layer comprises polyacetylene, polyaniline, polypyrrole, polythiophene, derivatives thereof, or combinations thereof.

12. The short-wave infrared detector of claim 1, wherein:
the conductive layer comprises indium tin oxide (ITO), fluorine doped tin oxide (FTO), aluminum doped zinc oxide, indium zinc oxide (IZO), indium-doped cadmium oxide, barium stannate, strontium vanadate, calcium vanadate, or combinations thereof; and the hole transport layer comprises poly(3,4-ethylenedioxythiophene) (PEDOT), poly(3,4-ethylenedioxythiophene) polystyrene sulfonate (PEDOT:PSS), poly(4,4-dioctylcyclopentadithiophene), or combinations thereof.

13. A short-wave infrared detection system, comprising:
at least one processor;
an illumination source configured to illuminate a sampled location of an object or a scene; and
a detector configured to detect light from the sampled location, the detector comprising:
 a conductive layer having a trech therein;
 a hole transport layer, at least a portion of the hole transport layer positioned within the trench of the conductive layer; and
 a light conversion layer disposed over the hole transport layer, the light conversion layer comprising a composition of formula (I):

$$A_a B_b M_c X_d \quad (I),$$

wherein:
 A of formula (I) is an organic group or ion thereof;
 B of formula (I) is an organic group, an inorganic group, or ion thereof, B and A being the same or different;
 M of formula (I) is a metal or ion thereof;
 X of formula (I) is a halogen or ion thereof; and
 a, b, c, and d of formula (I) are numbers expressing amounts of A, B, M, and X.

14. The short-wave infrared detection system of claim 13, wherein the at least one processor is configured to create an absorption image of the object or the scene.

15. The short-wave infrared detection system of claim 13, wherein:
the hole transport layer comprises polyacetylene, polyaniline, polypyrrole, polythiophene, derivatives thereof, or combinations thereof; and
the conductive layer comprises a conductive oxide.

16. The short-wave infrared detection system of claim 13, wherein:
M of formula (I) is Pb, Sn, Ge, or ion thereof;
A of formula (I) is selected from the group consisting of methylamine, dimethylamine, trimethylamine, ethylamine, diethylamine, triethylamine, trisopropylamine, aziridine, diaziridine, formamidine, amidine, guanidine, methylammonium, dimethylammonium, trimethylammonium, ethylammonium, diethylammonium, triethylammonium, triisopropylammonium, aziridinium, diaziridinium, formamidinium, amidinium, guanidinium, and combinations thereof; or
combinations thereof.

17. A method, comprising:
directing a light beam comprising short-wave infrared light from an illumination source towards an object and illuminating a sampled location on the object; and
detecting, by a detector, light absorbed or reflected by the sampled location on the object, the detector comprising:
 a conductive layer having a trench therein;
 a hole transport layer, at least a portion of the hole transport layer positioned within the trench of the conductive layer; and
 a light conversion layer disposed over the hole transport layer, the light conversion layer having a thickness from about 200 nm to about 800 nm, the light conversion layer comprising a composition of formula (I):

$$A_a B_b M_c X_d \quad (I),$$

wherein:
 A of formula (I) is an organic group or ion thereof;
 B of formula (I) is an organic group, an inorganic group, or ion thereof, B and A being the same or different;
 M of formula (I) is a metal or ion thereof;
 X of formula (I) is a halogen or ion thereof; and
 a, b, c, and d of formula (I) are numbers expressing amounts of A, B, M, and D.

18. The method of claim 17, further comprising creating an image based on the detected light.

19. The short-wave infrared detection system of claim 13, wherein:
the conductive layer comprises indium tin oxide (ITO), fluorine doped tin oxide (FTO), aluminum doped zinc oxide, indium zinc oxide (IZO), indium-doped cadmium oxide, barium stannate, strontium vanadate, calcium vanadate, or combinations thereof; and
the hole transport layer comprises poly (3,4-ethylenedioxythiophene) (PEDOT), poly (3,4-ethylenedioxythiophene) polystyrene sulfonate (PEDOT: PSS), poly (4,4-dioctylcyclopentadithiophene), or combinations thereof.

20. The method of claim 17, wherein:
the conductive layer comprises indium tin oxide (ITO), fluorine doped tin oxide (FTO), aluminum doped zinc oxide, indium zinc oxide (IZO), indium-doped cadmium oxide, barium stannate, strontium vanadate, calcium vanadate, or combinations thereof; and
the hole transport layer comprises poly (3,4-ethylenedioxythiophene) (PEDOT), poly (3,4-ethylenedioxythiophene) polystyrene sulfonate (PEDOT: PSS), poly (4,4-dioctylcyclopentadithiophene), or combinations thereof.

* * * * *